United States Patent [19]

Iskanderova et al.

[11] Patent Number: 5,683,757
[45] Date of Patent: Nov. 4, 1997

[54] SURFACE MODIFICATION OF POLYMERS AND CARBON-BASED MATERIALS BY ION IMPLANTATION AND OXIDATIVE CONVERSION

[76] Inventors: Zelina A. Iskanderova, 35 Canyon Ave., #2011, Downsview, Ontario, Canada, M3H 4Y2; Jasha I. Kleiman, 205 Chelwood Drive, Thornhill, Ontario, Canada, L4J 7C3; Yuri Gudimenko, 437 Glen Park Avenue Apt. 207, North York, Ontario, Canada, M6B 2E8; Grant Rheal Cool, 625 Finch Ave. W. Apt. 1209, Willowdale, Ontario, Canada, M2R 3W1; Roderick C. Tennyson, 104 McClure Drive, King City, Ontario, Canada, L0G 1K0

[21] Appl. No.: 519,510

[22] Filed: Aug. 25, 1995

[51] Int. Cl.$^6$ .................. C23C 14/12; C23C 14/14; H05H 1/00; B05D 5/06
[52] U.S. Cl. .................. 427/525; 427/527; 427/529; 427/531; 427/536; 427/539; 427/553; 427/534; 427/537; 427/164
[58] Field of Search .................. 427/525, 527, 427/531, 534, 539, 553, 377, 536, 537, 164

[56] References Cited

U.S. PATENT DOCUMENTS

| | | | |
|---|---|---|---|
| 3,953,662 | 4/1976 | Addiss, Jr. et al. | 427/164 |
| 4,052,520 | 10/1977 | Chang et al. | 427/164 |
| 4,107,350 | 8/1978 | Berg et al. | 427/525 |
| 4,161,547 | 7/1979 | Kienel | 427/164 |
| 4,161,560 | 7/1979 | Kienel | 427/164 |
| 4,172,156 | 10/1979 | Ritter et al. | 427/539 |
| 4,323,589 | 4/1982 | Ray et al. | 427/539 |
| 4,374,867 | 2/1983 | Nahory et al. | 427/539 |
| 4,377,437 | 3/1983 | Taylor et al. | 156/643 |
| 4,410,611 | 10/1983 | MacIver . | |
| 4,452,827 | 6/1984 | Kolev et al. . | |
| 4,478,874 | 10/1984 | Hahn | 427/525 |
| 4,554,208 | 11/1985 | MacIver et al. . | |
| 4,560,577 | 12/1985 | Mirtich et al. | 427/525 |
| 4,568,563 | 2/1986 | Jackson et al. | 427/525 |
| 4,601,913 | 7/1986 | Chaloux et al. | 427/539 |
| 4,743,493 | 5/1988 | Sioshansi et al. . | |
| 5,130,161 | 7/1992 | Mansur et al. . | |
| 5,223,309 | 6/1993 | Farivar et al. | 427/525 |
| 5,407,992 | 4/1995 | Lee et al. | 427/525 |
| 5,424,131 | 6/1995 | Wertheimer et al. | 427/578 |
| 5,436,035 | 7/1995 | Lohwasser | 427/525 |
| 5,462,779 | 10/1995 | Misiano et al. | 427/527 |

FOREIGN PATENT DOCUMENTS

| | | | |
|---|---|---|---|
| 5110127 | 8/1980 | Japan | 427/525 |

OTHER PUBLICATIONS

Adesida, "Ion Bombardment of Resists", *Nuclear Instruments and Methods* 209/210 (1983) pp. 79–86 no month.

(List continued on next page.)

*Primary Examiner*—Marianne Padgett
*Attorney, Agent, or Firm*—Riches, McKenzie & Herbert

[57] ABSTRACT

This invention provides an improved process for surface modification of polymers, graphites and carbon-based composite materials, and improved surface-modified materials produced by the process. The preferred surface modification process of the present invention comprises the steps of: high dose single or multiple implantation of the substrate with energetic ions, including ions of at least one metal or semi-metal element able to form a stable, non-volatile oxide; and oxidative full or partial conversion of an upper portion of the implanted layer to a continuous, resistant oxide-enriched surface layer. The process may also comprise the additional implantation of a hardening non-metal element to participate in the formation of a glass-like surface layer or to form a carbonized, hardened sub-layer. Surface modified materials of the present invention have substantially improved resistance to erosion by atomic oxygen and to thermal cycling, as well as improved resistance to UV/air, improved surface hardness and wear resistance, tailored optical properties and altered surface energy, making them potentially useful in aerospace as well as other industries.

19 Claims, 8 Drawing Sheets

OTHER PUBLICATIONS

Beale et al., "The Mechanism of Ion Implantation Passivation of PMMA for Lithography with Dry Etch Development", *Microelectronic Engineering* 3 (1985) pp. 451–458 no month.

Venkatesan et al. "Plasma–Developed Ion–Implanted Resists with Submicron Resolution", *J. Vac. Sci. Technol.*, 19(4), Nov./Dec. 1981, pp. 1379–1384.

T. Gillespie, R. Wendt, "Proceedings of EOIM–3 BMDO Experiment Workshop", Jet Propulsion Laboratory, Jun. 22–23, 1993, Arcadia, California.

Dever et al., "AIAA 92–0794, Synergistic Effects of Ultraviolet Radiation, Thermal Cycling and Atomic Oxygen on Altered and Coated Kapton Surfaces", American Institute of Aeronautics and Astronautics, 30th Aerospace Sciences Meeting & Exhibit, Jan. 6–9, 1992, Reno, NV.

Sheehan, "Oxidation–Resistant Carbon—Carbon Composites", Engineered Materials Handbook, vol. 1, Composites, pp. 920/921 No Date.

Batha et al., "Structurally Reinforced Carbon—Carbon Composites", Engineered Materials Handbook, vol. 1, Composites, pp. 922–924 no date.

Öchsner et al., "Improvement of Surface Properties of Polymers by Ion Implantation", *Nuclear Instruments and Methods in Physics Research* 880/81 (1993) pp. 1050–1054 (no month).

"Polymer Develops Oxide Layer, Resists Atomic–Oxygen Erosion", *Advanced Materials and Processes* Apr. 1995, p. 12 no author.

Lewis et al., "Residual Gas and Ion–Beam Analysis of Ion–Irradiated Polymers", *Nuclear Instruments and Methods in Physics Research* B61 (1991) pp. 457–465 no month.

Lee et al., "Improved Surface Properties of Polymer Materials by Multiple Ion Beam Treatment", *J. Mater. Res.* vol. 6, No. 3, Mar. 1991; pp. 610–628.

Davenas et al., "Role of the Modifications Induced by Ion Beam Irradiation in the Optical and Conducting Properties of Polyimide", *Nuclear Instruments and Methods in Physics Research* B32 (1988) 136–141 no month.

Fink et al., "Optically Absorbing Layers on Ion Beam Modified Polymers: A Study of Their Evolution and Properties", *Nuclear Instruments and Methods in Physics Research* B32 (1988) pp. 125–130 no month.

Kenny et al., "Ion–Implanted Graphitic Carbons", *Nuclear Instruments and Methods in Physics Research* B39 (1989) pp. 704–707 no month.

Xu et al., "Infrared Analysis of the Irradiation Effects in Aromatic Polyimide Films", *Nuclear Instruments and Methods in Physics Research* B80/81 (1993) 1063–1066 no month.

Suzuki et al, "Surface Modification of a Plastic Substrate During Ion Plating", *Thin Solid Films*; 80(1981–no month), pp. 67–76.

SURFACE MODIFICATION OF POLYMERS AND CARBON-BASED MATERIALS BY ION IMPLANTATION AND OXIDATIVE CONVERSION

FIELD OF THE INVENTION

This invention relates to surface modification of polymers, carbon-based materials and composites by ion implantation, followed by oxidative conversion of the implanted layers, to provide surface-modified materials having enhanced properties.

BACKGROUND OF THE INVENTION

Polymeric solids and carbon-based composites have many unique advantages over other materials and have therefore risen in importance in recent years. For example, polymers are lightweight, can be moulded into intricate shapes, are corrosion-resistant, have versatile electronic properties and low manufacturing costs. However, due to their inherent softness and susceptibility to degradation in oxidizing and/or ultraviolet (UV) environments, their use has generally been limited to relatively mild service applications. They also often have low chemical resistance, low resistance to photo-oxidative degradation, and are rapidly eroded or etched in extremely oxidative environments, such as plasma or atomic oxygen (AO) fluxes. Carbon-based composite materials, for example, carbon fiber-reinforced plastic (CFRP) composites and carbon fiber-carbon composites, are lightweight, tough and rigid, making them very attractive materials for spacecraft components. However, like polymers, composites are also eroded in extremely oxidative environments.

The use of polymers and composite materials in spacecraft exemplifies these problems. To date, the widespread use of polymers and composites in space missions on a prolonged basis has not been possible due to their low erosion resistance in the presence of active oxygen species, such as AO, which is found in the residual atmosphere surrounding the Earth in low Earth orbit (LEO).

Atomic oxygen, which is formed in the ionosphere through dissociation of $O_2$ by vacuum ultraviolet radiation (VUV) having wavelengths in the range of 100 to 200 nm, is the predominant species in the LEO environment at altitudes between 200 and 700 km. Even at higher altitudes, AO remains a significant constituent. AO density in LEO is not particularly high at altitudes of most orbiting vehicles such as satellites. For example, the number density of AO at about 250 km altitude is $10^9$ atoms/cm$^3$, which corresponds to the density of residual gas in a vacuum of $10^{-7}$ torr. However, due to the high orbital velocity (approximately 8 km/sec at Space Shuttle altitude) of orbiting vehicles, the flux is high, being of the order of $10^{15}$ atoms/cm$^2$ sec. Furthermore, this high orbital velocity corresponds to collisions with highly energetic oxygen atoms having a kinetic energy of about 5.3 eV. Atomic oxygen having kinetic energy of about 1 eV or higher is commonly referred to as "fast atomic oxygen" (FAO) or "hyperthermal atomic oxygen" (HAO).

When exposed to such energetic FAO, polymeric materials, graphite and carbon-based composites have been shown to undergo significant accelerated surface erosion and mass loss. Materials eroded by exhibit a significantly altered surface morphology on a micron scale, having a roughened, "carpet-like" texture.

Many different types of polymers and composites have been examined in LEO flight and in ground-based testing facilities. Hydrocarbon polymers which presently are most commonly considered for use in the LEO environment include Kapton (a polyimide) and Mylar [poly(ethylene terephthalate)]. The term "hydrocarbon" as used herein refers to polymers containing both carbon and hydrogen and which may also contain other elements. Also used are composite materials such as Kapton film having a thin layer of aluminum on one side, carbon fiber-carbon composites comprising carbon fibers in a resin-derived carbon matrix, and CFRP composites such as carbon fibers bonded with epoxy resins or PEEK [poly(ether ether ketone)].

Kapton and epoxies have LEO erosion yields of about $(2.5-3) \times 10^{-24}$ cm$^3$/at, i.e., $(3-4) \times 10^{-24}$ g/atom of atomic oxygen. Many other polymers and carbon-based materials, such as graphite, carbon fiber-carbon composites and CFRP composites, also have erosion rates of this order of magnitude, typically about $(1-4) \times 10^{-24}$ g/atom. In CFRP or carbon fiber-carbon composites, the top 10–20 µm of material usually consists of a polymeric or carbon matrix, respectively, with carbon or graphite fibers bonded in the matrix below the surface. In long-duration missions, erosion of both the matrix and the carbon fibers has been observed. These materials having erosion rates on the order of $10^{-24}$ g/atom are unsuitable for long term use in the LEO environment without alteration or protection.

One attempted solution to this problem has been the synthesis of new materials having higher erosion resistance. However, the use of these materials has met with only limited success. For example, the use of silicon-containing polymers, such as polysilicones or polysiloxanes having improved erosion resistance, has not been fully successful to date due to problems such as darkening and surrounding organic surface contaminations. Another specially synthesized polymeric materials is "AOR Kapton", a polyimide-polysiloxane made from silicone and polyimide. However, this material exhibits surface morphology changes when exposed to AO flux and has an erosion yield too high to withstand long duration missions in LEO, as for example in the Space Station Freedom which is expected to have a lifetime of fifteen years.

In general, because of the numerous requirements which must be met by materials for use in space, it is more attractive to employ commonly used, approved, industrially produced polymers, which have been protected by appropriate coatings or surface modification, rather than to synthesize new materials. Preferably, the protection scheme should not alter the properties of the bulk material. Protection of polymers and composites is currently performed in a number of ways ranging from thick blankets of glass to sophisticated thin film coatings. Thin film protective coatings typically comprise oxides such as silicon and aluminum oxides deposited on the surfaces of polymers or composites by chemical vapor deposition or electron or ion beam sputtering.

Although thin film oxide coatings are highly resistant to active oxygen fluxes, the disadvantage exists that polymers or composites having these coatings typically have low resistance to thermal cycling in the LEO environment and are therefore unsuitable for use on long duration space missions. Thermal cycling occurs, for example, when a spacecraft passes in or out of the Earth's shadow, or when shadows are cast on surfaces of the spacecraft by structural members. This may cause rapid temperature fluctuations on the order of 300° C. on the affected surfaces.

When polymers or composites having thin film coatings of oxides are exposed to thermal cycling in the LEO space environment, cracking and/or spalling typically occurs in the oxide coating, primarily due to the difference between the coefficient of thermal expansion of the coating and that of the underlying bulk material, and also due to interfacial stresses at the interface between the coating and the bulk material. High interfacial stresses in coated materials are caused by the typically sharp transition between the coating and the underlying bulk material.

Cracking or spalling of the oxide coating leaves the underlying material exposed. When FAO strikes a cracked or spalled region on the exposed polymer surface, etching of the polymer underlying the oxide coating occurs. Furthermore, the cracked or spalled region tends to deepen and widen due to undercutting of the polymer under the oxide coating at the edges of the cracked or spalled regions.

In general, hard dielectric protective or tribological coatings, produced by metal or semi-metal oxide deposition, are now used on plastics for a variety of terrestrial applications. In any extreme conditions, the structure, uniformity and quality of the coatings, and the adhesion and stresses at the interface of the coatings and plastics are the most vulnerable points, with the latter two being the major causes of failure.

Therefore, it is highly desirable for space and many terrestrial needs to provide polymers and other carbon-based materials having a continuous oxide-based, durable, hard, resistant outer layer, and having a graded transition such that interfacial stresses are minimized, thus permitting the material to withstand both atomic oxygen fluxes and thermal cycling in the LEO environment, as well as severe conditions in terrestrial applications.

Surface modification of polymers has been used as an alternate method for providing polymers with altered surface properties. Surface modification is potentially superior to coating of materials in that it has the potential to produce modified materials in which a graded transition exists between the modified surface layer and the underlying bulk material. This would substantially reduce interfacial stresses during thermal cycling to provide better adhesion of the coating to the bulk material, thus providing better resistance to cracking and spalling caused by thermal cycling in LEO. However, surface modified materials produced to date are not suitable for long term use in the LEO environment.

Ion implantation is one known method of surface modification which is capable of altering the surface characteristics of organic polymeric materials. In ion implantation, a polymer surface is bombarded with energetic non-metal, metal and/or semi-metal ions. Ion-implanted polymers are known to have increased surface hardness, wear resistance and, to some extent, increased resistance to oxygen plasma etching and chemical attack. However, it is now known that these enhanced properties are to a large extent produced by cross-linking and carbonization of the polymer surface caused by the ion bombardment, and not by the implanted ions themselves. For example, in Beale et al., "*Mechanism of Ion Implantation Passivation of PMMA*", Microelectronic Engineering 3 (1985) 45-458, at 457, it was concluded that the decreased etch rate of an ion implanted polymer resist in an oxygen plasma was a result of the energy deposited by the implant and could not be attributed to the implanted species themselves.

As may be expected, ion bombardment of a polymer causes bonds to be broken. Carbonization is one result of the breaking of bonds by the implanted ions, resulting in depletion of volatile elements such as hydrogen, nitrogen and oxygen from the top layer of the polymer and a consequent increase in the concentration of carbon. The breaking of a polymer's bonds will naturally result in the formation of new bonds, some of which will be intermolecular "cross-links" between two or more polymer chains. The presence and degree of cross-linking have a profound influence on both the chemical and mechanical properties of the material in which they occur.

Carbonization during implantation visibly darkens the polymer, changing its color, decreasing its degree of transparency, and increasing its electrical conductivity. Thus, carbonization can negatively affect optical and thermal properties of polymers, which can be extremely important for space applications. Some examples of thermal and/or optical properties are transmittance, reflectance, optical absorption, colour, shade, thermal expansion coefficient, etc. Further, carbonization and cross-linking by ion implantation do not provide sufficient, full protection against AO and may cause surface embrittlement in treated materials. After complete etching of the carbonized layer, the etching yield of the treated polymer in oxygen plasma has been shown to be the same as for pristine materials.

U.S. Pat. No. 4,743,493 to Sioshansi et al discloses ion implantation of plastics (polycarbonates, acrylics, their combinations, and ultra high molecular weight polyethylene) with single metal elements, fluorine or chlorine to enhance their surface hardness and their resistance to chemical attack. Under the conditions utilized by Sioshansi, the enhanced hardness and chemical resistance is due to cross-linking and carbonization in the plastics under implantation, as discussed above with reference to the Beale paper. Therefore, plastics modified as described by Sloshansi could not withstand prolonged use in the LEO environment.

Further disadvantages of the Sioshansi process are darkening (colour change) resulting in reduction of optical transmission, and surface embrittlement of the treated materials.

U.S. Pat. No. 5,130,161 to Mansur et al discloses processes for hardening surfaces of polymers by multiple non-metal ion bombardment, causing cross-linking, followed by ion implantation with ions of elements which, when reacted with the elements of the polymer, form precipitate compounds having a hardness greater than the hardness of the polymer. The Mansur processes utilizes high energy ions of higher than about 0.2 MeV, and fluences less than or equal to about $4 \times 10^{15}$ atoms/cm$^2$. The major hardening effects produced under these conditions result from carbonization and cross-linking produced by the ion bombardment. The precipitate compounds do not form a continuous, protective layer and therefore the Mansur process does not result in materials able to withstand the LEO environment for prolonged periods.

U.S. Pat. No. 4,377,437 to Taylor et al discloses a method of device lithography by selective ion implantation, where the implanted ions (for example, indium or gallium ions) are used to selectively define a pattern on a material, typically a polymer. The implanted region reacts with a plasma (for example, an oxygen plasma) to form a patterned, nonvolatile layer containing indium or gallium oxide. Subsequent etching of unimplanted regions, typically by the same plasma, produces a negative tone pattern. The invention, as mentioned by the authors, relates to a lithography technique, the concern being the "etch rate ratio" of the implanted and unimplanted areas, which is mentioned to be at least 1.3 times. The best result for implantation in an organic polymeric substrate, presented in Example 2, shows an etch rate ratio of 32 after short term (about 20 minutes) exposure to oxygen plasma. There is no indication whether or not the materials modified by Taylor would be suitable for use in space and could withstand long term exposure to FAO and thermal cycling in the LEO environment. An etch rate ratio of about 30 would not provide materials with sufficient erosion resistance to withstand the LEO environment in long duration missions.

Therefore, the disadvantage exists that no polymeric materials or composites known to date, however modified, possess sufficient erosion resistance to make them suitable for use for extended periods of time (long duration missions) in the LEO environment.

Another disadvantage exists that no known polymeric materials or composites have a continuous, graded, oxide-based, stable, durable, protective, AO-resistant surface layer which is at the same time resistant to thermal cycling (in the LEO environment).

Another disadvantage exists that no surface modification processes are known capable of providing surface-modified polymeric or composite materials able to withstand long-term exposure to FAO and thermal cycling in the LEO environment and which either leave the optical and thermal properties of the bulk material substantially unchanged or provide the ability to tailor the optical and thermal properties of the material.

SUMMARY OF THE INVENTION

To overcome the above disadvantages, the present invention provides a new surface modification process for providing a stable, erosion-resistant, oxide-enriched surface layer on polymeric materials, graphites and composites. Surface-modified materials according to the present invention have erosion resistance to FAO substantially higher than that of polymeric and carbon-based composite materials presently used for space applications, and would be expected to have superior performance in long space missions. The process of the present invention also allows the production of surface-modified materials having improved resistance to thermal cycling and preferably having unchanged or tailored thermal and optical properties.

Therefore, surface-modified materials produced by the process of the present invention are potentially useful in space and in numerous terrestrial applications.

The surface modification process according to the present invention comprises the following two steps:
1. Ion implantation, wherein the surface of a polymer, graphite or composite substrate is bombarded with high doses of one or more energetic metal and/or semi-metal ions capable of forming non-volatile, stable oxides, the ions penetrating into the top surface layer and subsurface layer of the substrate; and
2. Oxidative full or partial conversion of the implanted layer to form a continuous, durable, protective, oxidation and erosion resistant surface layer enriched in oxides of the implanted ions, the oxidative conversion step preferably comprising exposure of the implanted polymer, graphite or composite surface to FAO, UV+air, UV+ozone or an oxygen plasma.

The above process provides surface-modified materials having a stable, continuous, graded, oxide-enriched surface layer, while leaving the bulk properties of the underlying material substantially unaffected. Materials modified according to the present invention are expected to be useful for extended periods of time in the LEO space environment without substantial mass loss and surface morphology changes when the material is exposed to FAO flux. The inventors have found that the observed mass loss of modified materials according to the present invention is less than about $10^{-26}$ g/atom of atomic oxygen, and may be reduced to 0, when the material is exposed to FAO flux.

Materials modified according to the present invention also show a reduced tendency to crack and spall under thermal cycling conditions compared to known materials having thin film protective oxide coatings. This improved resistance to thermal cycling is believed to be at least partially due to the graded nature of the modified surface layer, there being no sharp interface between the modified layer and the substrate. More specifically, graded transitions are formed between the oxide-enriched surface layer and the underlying material and between the implanted layer and the substrate. Therefore, interfacial stresses are reduced during thermal cycling resulting in substantially reduced cracking and spalling.

Resistance to thermal cycling may preferably be further improved by tailoring the coefficient of thermal expansion of the modified layer to be as close as possible to that of the substrate by ion implantation of appropriate species.

Further, underneath the oxide-enriched layer, there is typically a layer containing a "tail" of implanted species which have not been oxidized by the oxidative conversion. The distribution of implanted species in this subsurface layer is also preferably graded. This provides the surface modified polymer with "self-healing" properties. If, for example, the oxide enriched layer is cracked or partially chipped away while the modified material is in the LEO space environment, FAO will cause a new oxide enriched layer to form on the exposed portion of the underlying material containing unoxidized implanted species. Further, even if surface cracks form, the self-healing properties will substantially prevent deepening and widening of the cracks due to undercutting and thereby minimize damage to the underlying material.

Unlike previously known ion implantation processes, the present invention provides materials having a continuous, oxide-enriched surface layer, providing a reduction in erosion yield of at least two orders of magnitude over unmodified polymeric materials combined with increased resistance to thermal cycling, which has not been achieved by known processes.

The present invention provides further improvements over the prior art in that it is capable of simultaneously improving oxidation and erosion resistance of polymers and surface mechanical properties without changing their colour and transparency, that is without the darkening caused by known ion implantation processes. This aspect is especially useful, and is required, for solar array blankets in space, and for other optical space applications such as organic lenses, solar concentrators and retroreflectors. Optical properties are also critically important in many terrestrial applications utilizing transparent plastics such as organic glasses (PMMA, polycarbonate, acrylic) and transparent or decorative polymer films, coatings and articles.

Although the process of the present invention is useful for producing erosion-resistant and thermal cycling-resistant polymers and composites for use in the space and aerospace industries, it is not limited thereto and may be used to modify and tailor the properties of a wide variety of commercially available polymers and carbon-based composite materials for various uses. The method of the present invention may be used to alter properties such as oxidation and wear-resistance, surface hardness, moisture resistance, coefficient of friction, hydrophobicity, lubricity, optical properties such as refractive index, colour, shade, degree of transparency, surface conductivity, and improved performance in different weathering conditions such as $UV+O_2$.

Further, the process of the present invention can be conveniently performed with thin films and with moulded articles of various shapes, producing a hard oxide-enriched surface layer while leaving the bulk properties of the underlying polymer substantially unchanged.

Therefore, the process and the surface modified polymers and composites according to the present invention also have potential uses in numerous other industries, for example, automotive, electronic, biomedical, environmental and building products.

It is one object of the present invention to provide a surface modification process for producing polymers, graphites and carbon-based composites having substantially improved erosion resistance and resistance to thermal cycling in a LEO space environment.

It is another object of the present invention to provide surface modified polymers, graphites and carbon-based composite materials having improved erosion resistance and resistance to thermal cycling in LEO space environment.

It is yet another object of the present invention to provide a surface modification process for producing polymers, graphite and carbon-based composites having a graded surface layer enriched with oxides of metal and/or semi-metal elements.

It is yet another object of the present invention to provide surface modified polymeric materials, graphite and carbon-based composites having a graded surface layer enriched with oxides of metal and/or semi-metal elements.

It is yet another object of the present invention to provide a surface modification process for producing polymers, graphites and carbon-based composites having substantially improved resistance to oxidative or photooxidative degradation in UV/air or UV/ozone, and having tailored surface energy, mechanical, thermal and optical properties.

It is yet another object of the present invention to provide surface-modified polymers, graphites and composites having substantially improved resistance to oxidative or photooxidative degradation in UV+air or UV+ozone and having tailored surface energy, mechanical, thermal and optical properties.

In one aspect, the present invention provides a surface modification process for forming a continuous, graded, erosion-resistant, oxide-enriched surface layer on a solid substrate. The process of the present invention comprises two steps, a first ion implantation step and a second oxidative conversion step.

Ion implantation of the solid substrate comprises bombardment of the substrate with at least one ion species selected from the group comprising ions of metal and semi-metal elements capable of forming stable, non-volatile oxides, to form an upper implanted layer of the substrate containing at least one implanted element selected from the metal and semi-metal elements, a graded transition being formed between the implanted layer and underlying substrate.

The oxidative conversion takes place in at least an upper portion of the implanted layer and comprises etching by active oxygen of material from the implanted layer and oxidation by the active oxygen of the implanted elements in the implanted layer.

The surface-modified material produced by these two steps has higher erosion resistance to atomic oxygen than the unmodified substrate, and has a continuous surface layer containing a protective compound formed by combination of at least one of the implanted elements with oxygen, a graded transition being formed between the surface layer and the substrate, in cases where the entire implanted layer is oxidatively converted, or between the surface layer and the implanted layer, in cases where only an upper portion of the implanted layer is oxidatively converted.

In another aspect, the present invention provides a surface-modified material having improved resistance to atomic oxygen flux, comprising lower, middle and surface layers.

The lower layer comprises a solid substrate selected from the group comprising organic polymers, metallized polymer films, graphite and carbon fiber reinforced composite materials. The middle layer is modified and comprises substrate treated by implantation therein of at least one ion species selected from ions of metal and semi-metal elements capable of forming stable, non-volatile oxides. The surface layer is continuous and contains a protective compound comprising at least one of the metal and semi-metal elements combined with oxygen. The surface-modified material of the present invention has graded transitions existing between the surface layer and the middle layer and between the middle layer and the lower layer.

The solid substrate is selected from the group comprising polymers, metallized polymer films, graphite and carbon fiber reinforced composite materials, the polymers and polymer films containing carbon and hydrogen. Preferably, the polymer substrate is selected from the group comprising polyolefins, polyacrylates, polycarbonates, polyesters, polyethers, polyurethanes, polyamides and polyimides. More preferably, the polymer substrate is selected from the group comprising Kapton, Mylar and PEEK, the metallized polymer film is a Kapton film having a layer of aluminum on one side, and the carbon fiber reinforced composite material is selected from the group comprising carbon fibers in a matrix of epoxy resin, PEEK or resin-derived carbon.

Preferably, the metal elements are multivalent metal elements selected from the group comprising Al, Ti, Sc, Sn, Zr, Hf, Cr, Mo, V, Ce, Sm and Gd, and the semi-metal element is Si.

Preferably, the surface layer produced on the modified material has improved resistance to thermal cycling and has a coefficient of thermal expansion similar to that of the substrate.

A preferred aspect of the present invention, includes the additional implantation of an ion species comprising ions of a non-metal element, such that the protective compound contains said non-metal element. More preferably, the ion species comprise ions of Si and B and the surface layer contains a protective compound having a composition of Si, B and O similar to that of borosilicate glass, or the ion species comprise ions of Si and P and the surface layer contains a protective compound having a composition of Si, P and O similar to that of phosphorosilicate glass.

An alternate preferred aspect of the present invention additionally comprises the implantation of an ion species comprising ions of a non-metal element, wherein a hardened, carbonized sub-layer containing the non-metal element is formed underneath the surface layer.

Preferably, the ion species are implanted with an energy of about 25 keV to about 50 keV and a fluence of about $5 \times 10^{16}$ ions/cm$^2$ to about $1 \times 10^{17}$ ions/cm$^2$.

Preferably, the non-metal ion species is implanted with an energy of about 10 keV to about 100 keV and a fluence of about $5 \times 10^{15}$ ions/cm$^2$ to about $10^{16}$ ions/cm$^2$.

Preferably, the active oxygen species is selected from the group comprising fast atomic oxygen, UV+air, UV+ozone and oxygen plasma.

Preferably, the erosion yield of the surface modified substrate, when exposed to fast atomic oxygen, is less than about $10^{-26}$ g/atom of atomic oxygen.

Preferably, the surface layer is transparent and the colour of the surface modified substrate is the same as that of the substrate prior to modification.

BRIEF DESCRIPTION OF THE DRAWINGS

Further aspects and advantages of the present invention will be apparent from the following description taken together with the accompanying drawings in which.

DETAILED DESCRIPTION OF THE PREFERRED EMBODIMENTS

Figure 1:
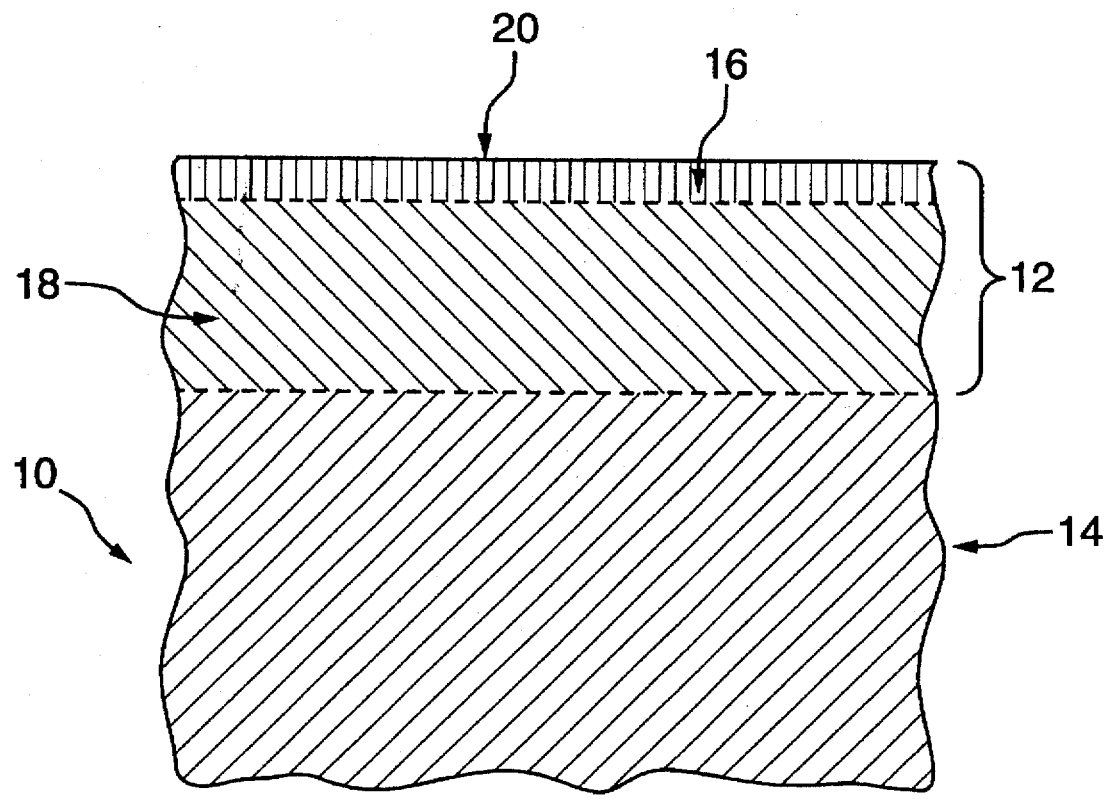
FIG. 1 is a sectional, side elevation schematic view showing the layered structure of a preferred surface-modified material according to the present invention.

As discussed above, the two-step process of the present invention produces polymeric materials having a quasi-layered structure, with graded transitions being formed between adjacent layers. FIG. 1 schematically illustrates an upper portion of a surface modified material 10 produced by the process of the present invention. Material 10 is shown as having a modified upper layer 12 and a lower layer 14 comprising unmodified bulk polymer. Upper layer 12 is produced by a first ion implantation step, wherein polymer 10 is bombarded with energetic ions. For convenience, FIG. 1 shows upper layer 12 and lower layer 14 being separated by an interface (dotted line). However, it is to be understood that the transition between layers 12 and 14 is graded and no identifiable interface exists.

The second oxidative conversion step converts an upper portion 16 of implanted layer 12 to a thin, oxide-enriched surface layer. The lower portion 18 of implanted layer 12 may remain substantially unchanged after conversion, i.e., may have a "tail" distribution of implanted metal, with or without a certain degree of carbonization. For convenience, FIG. 1 shows an interface between the oxide-enriched surface layer 16 and the underlying non-converted material 18 in layer 12. However, it is to be understood that the transition between layers 16 and 18 is graded and no identifiable interface exists. The concentration of oxide is highest at the upper surface 20 of oxide-enriched surface layer 16 and gradually decreases toward the bottom of layer 16.

Although FIG. 1 illustrates a lower portion 18 of implanted layer 12 remaining below oxide-enriched surface layer 16 after oxidative conversion, it is to be understood that the entire implanted layer 12 may be oxidatively converted. In such a case, a graded transition is formed directly between the oxide-enriched surface layer 16 and the underlying unmodified bulk polymer 14.

The preferred surface modification process according to the present invention comprises two steps:

Firstly, single or multiple implantation with energetic ions, including ions of at least one metal or semi-metal element that can form stable, non-volatile oxides, with or without the additional implantation of a hardening non-metal element; and Secondly, oxidative full or partial conversion of an upper portion of the implanted layer to a continuous, resistant oxide-enriched surface layer.

Preferred embodiments of these two steps are now discussed in detail.

1. Ion Implantation

The first step of the surface modification process according to the present invention comprises high-dose ion implantation of a solid substrate with at least one ion species, the implanted ions coming to a stop in the substrate.

Preferably, the solid substrate used in the present invention comprises: a hydrocarbon polymeric material selected from the group comprising polyolefins, polyacrylates, polycarbonates, polyesters, polyethers, polyurethanes, polyamides and polyimides; carbon-based materials such as graphites; polymeric films metallized on one side; and composite materials containing carbon fibers in a polymeric plastic (resin) matrix (CFRP composites) or in a resin-derived carbon matrix (also referred to as "carbon-carbon" composites).

Particularly preferred substrates are materials which are used in the space industry, preferably polymeric materials such as polypyromellitimide polyimide, known as Kapton, polyaryl ether ether ketone, known as PEEK, polyethylene terephthalate, known as Mylar, carbon-based materials such as graphite, and composite materials such as Kapton aluminized on one side and carbon fibers bonded with epoxy resins or PEEK. The repeating units of Kapton and PEEK are shown below.

KAPTON

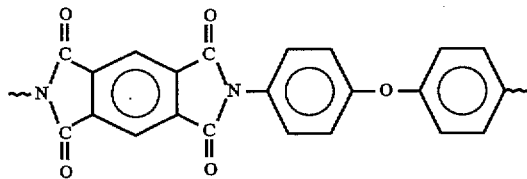

PEEK

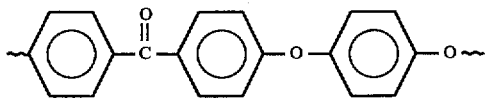

Other particularly preferred polymers which may be modified according to the present invention include organic glasses, such as poly(methyl methacrylate) (PMMA), polycarbonates and acrylics, and polyurethanes as used in medical devices such as catheters, artificial heart valves and endotracheal tubes.

It is to be understood that the selection of a preferred substrate is highly dependent on the intended use of the modified material. The process of the present invention would be expected to provide satisfactory results on most polymers, composites and other carbon-based materials.

At least one ion species used in the ion implantation is selected from the group comprising ions of metals and semi-metals capable of forming stable, non-volatile oxides. Preferably, the metal ions are selected from multivalent metals such as group III metals, group V metals, transition metals and rare earth metals. More preferred metal ions are ions of Al, Ti, Sc, Sn, Zr, Hf, Cr, Mo, V, Ce, Sm and Gd. For increased resistance to thermal cycling of modified Kapton, the most preferred metal ions are ions of those metals listed above which are able to form oxides having coefficients of thermal expansion closest to that of Kapton, such as Al, Ce, Gd and Sm.

The most preferred semi-metal for use in the process of the present invention is silicon.

In preferred embodiments of the present invention wherein one of the implanted elements is Si, the substrate may additionally be bombarded with ions of a non-metal "hardening" element. The most preferred non-metal elements are boron (B) and phosphorus (P). When ions of a hardening element are implanted at about the same depth as Si ions, special "glass-like" compounds containing the semi-metal element Si, the non-metal hardening element and oxygen may be formed at the conversion stage. Although, strictly speaking, these "glass-like" compounds are not oxides, surface layers containing these compounds are referred to herein as oxide-enriched surface layers.

Implantation of non-metal ions deeper than the metal and/or semi-metal ions provides the implanted material with an extended, cross-linked and carbonized, hardened sub-layer.

Preferably, one or more of the ions listed above are implanted into one of the preferred substrates listed above. In one aspect, it is preferred to implant two or more ion species at about the same depth to form transparent, colourless mixed oxides or glass-like compounds after oxidation. For double implantation, combinations of Si+B, Al+B, and Si+Al are preferred. For triple implantation, Si+Al+B is a preferred combination where a colour change due to carbonization is permissible.

Figure 2:
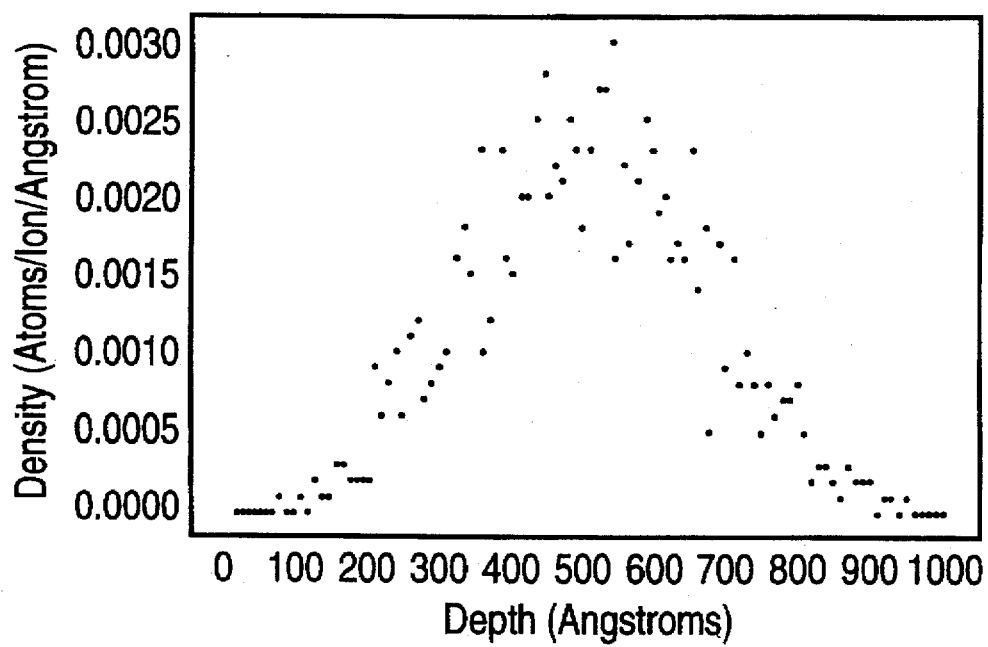
FIG. 2 is a plot of density against depth showing a computer-calculated depth distribution of Si implanted in Kapton at 25 keV.
Figure 3:
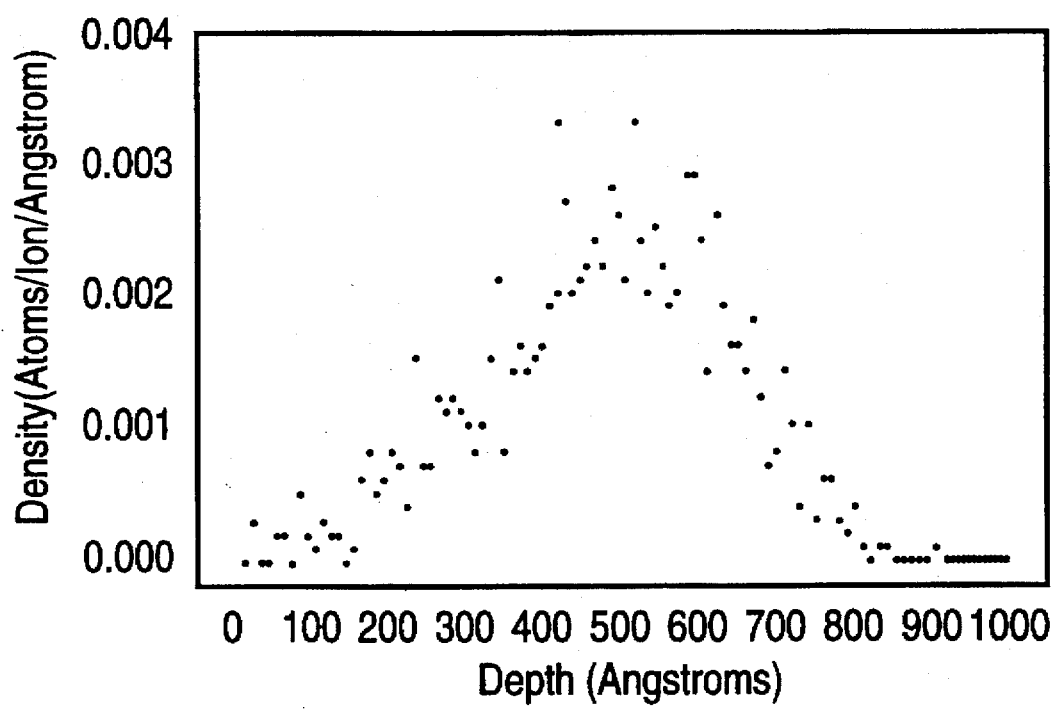
FIG. 3 is a plot of density against depth showing a computer-calculated depth distribution of B implanted in Kapton at 10 keV.

The inventors have found that, after oxidative conversion, the preferred combination of Si+B, implanted with depth distribution such as those shown in FIG. 2 for Si and FIG. 3 for B, forms a transparent glass-like compound contianing Si, B and O similar in composition and performance to borosilicate glass. Similarly, double implantation of Si+P produces a transparent glass-like compound similar in composition of Si, P and O to phosphorosilicate glass.

For double and triple implantation, sequential implantation at specially selected energies is preferred. However, it is to be appreciated that under certain conditions simultaneous implantation of two or more ion species may be preferred.

Alternately, different ions may be implanted in different layers of the substrate to provide the modified material with functionally graded properties or with a "second line of defence" in the form of an extended, cross-linked and carbonized, hardened sub-layer as discussed above. In this aspect, it is preferred to implant one or more ion species in an upper layer as discussed above, and to implant a non-metal ion species in a lower layer. The non-metal ion species provides a sub-layer hardened primarily through carbonization and cross-linking, which provides a second line of defence in the event of failure of the upper oxide-enriched surface layer.

The implantation of specially selected metals, for example transition metals such as chromium (Cr), molybdenum (Mo) and vanadium (V) can be used to form coloured oxides after oxidation or to tailor other thermal and optical surface properties for special terrestrial applications.

The ions are preferably implanted in the substrate with a kinetic energy in the range from about 10 keV to about 200 keV, most preferably about 25 keV to about 50 keV for metal ions and from about 10 keV to 100 keV for non-metal ions. To have the same depth of protective layer after conversion, the comparatively heavier metal species should be implanted at comparatively higher energies.

The preferred amounts of metal and non-metal ions implanted into the substrate, as measured by the fluence, should be sufficient to form continuous oxide-based surface layers after oxidation. The oxide-based surface layer formed after oxidative conversion preferably has a composition approaching the stoichiometric composition of a stable oxide of the implanted species. Therefore, the upper limits of the preferred fluences can be estimated from the stoichiometry of the desired oxides. More preferably, the fluence of metal and semi-metal ions is from about $5 \times 10^{16}$ to about $10^{17}$ ions/cm$^2$; and the fluence of non-metal ions, whether for forming glass-like compounds or a hardened sub-layer, is preferably from about $10^{15}$ to about $10^{16}$ ions/cm$^2$. The preferred fluence of non-metal ions required to form a hardened sub-layer is that required to provide a "saturated" carbonization effect in the sub-layer beneath the oxide-enriched surface layer.

The preferred fluences and energies of the ions depend on the mass of the particular ion being implanted, the particular substrate, and the desired depth of implantation, and can be estimated through computer simulations. The preferred fluences depend also, at least partially, on the oxidative ability of the implanted metal elements, that is, the relative ease with which the implanted species are oxidized. For example, it was found that a fluence of $1.5 \times 10^{16}$ ions/cm$^2$ was sufficient to prevent mass loss on Kapton by Sm and Gd implantation, but produced poor results for Al and Si, because Sm and Gd are more readily oxidized than Al and Si.

After the initial implantation, it is typically observed that the amount of implanted ions retained in the implanted layer (the retained dose) is less than the fluence. Preferably, this is taken into account when calculating the preferred fluence. The retained dose of implanted ions is typically in the range of about 60 to about 80% of the fluence, and more often about 70 to about 80% of the fluence.

Based on the computer simulations, the thickness of the metal implanted surface layer at the mentioned energies is at least from about 50 to about 200 nm, and for the non-metal implanted layer it is from about 200 to about 2,000 nm.

High flux densities are preferred so that ion implantation may be performed on a reasonable time scale, the maximum density being limited by thermal degradation effects that can occur in polymers under high flux implantation. The preferred implantation flux density is about 2–20 $\mu A/cm^2$, depending on the materials and ions, with the time of implantation being preferably from about 10 to about 90 minutes.

One useful effect of the ion bombardment according to the present invention is the ability to alter the surface energy, or the degree of hydrophobicity/hydrophilicity, of the ion implanted materials. Surface energy of the modified samples is measured by measuring the water contact angle of the material. A decrease in the surface energy of the treated surface has been observed in most samples implanted according to the present invention. Presumably, this is due to a reduction in the amount of oxygen and an increase in carbon content in the implanted layer, making the polymer surface more hydrophobic. This effect is most pronounced for high fluences and for heavy ions.

The implanted species generally exhibit a gaussian concentration distribution such as that shown in FIGS. 2 and 3. The mean projectile range, which is the depth below the surface of the substrate at which the concentration of an ion species reaches a maximum, can be estimated by computer calculations. Analysis by X-ray photospectroscopy (XPS), which provides a quantitative analysis of elements present in the top 3–5 nm of the polymeric substrate and their chemical state, typically does not show the presence of the implanted species at the surface of the polymeric substrate after the ion implantation step.

As discussed above, it is well known that ion implantation results in surface carbonization and cross-linking of polymeric substrates, and the inventors have found that carbonization also occurs in the implantation process of the present invention. The thickness of the carbonized layer is highly variable and may approach the thickness of the implanted layer. Higher degrees of carbonization are observed for heavier elements and higher fluences, with thicker carbonized layers being observed at higher energies.

2. Oxidative Conversion

As discussed above, the concentration of implanted species generally reaches a maximum at some distance below the surface of the implanted substrate. Therefore, it is clear that any oxidative treatment of the implanted substrate for oxidative conversion of the implanted species must involve simultaneous etching of the substrate in an upper portion of the implanted layer to expose the implanted elements, coupled with oxidation of the implanted species to form an oxide-enriched surface layer.

Preferably, the oxidative conversion is performed by exposure of the ion implanted substrate to an active oxygen source such as a beam of FAO, UV+air, UV+ozone or oxygen plasma, or any other source that can simultaneously etch the implanted and carbonized top surface layer of the substrate and oxidize the implanted species.

It is preferred that the substrate be etched to a depth sufficient to allow the formation of a continuous, oxide-enriched surface layer. Generally, this corresponds to the depth at which the concentration of one or more implanted species reaches a maximum, which at the regimes mentioned above is preferably greater than about 50 nm, depending on the ion mass and energy. After the oxide-enriched layer is formed, the rate of etching decreases and etching preferably stops.

The inventors have found that the objects of the invention may be fulfilled utilizing an oxidative conversion step which is either "full" or "partial". Full oxidative conversion is achieved when etching removes substantially the entire carbonized layer, resulting in little or no carbonized substrate remaining in or under the oxide-enriched surface layer. As discussed above, carbonization causes darkening of the substrate. When the carbonized layer is removed through etching, substrates implanted with ions that form transparent oxides, including glass-like compounds, typically regain their original colour and degree of transparency with oxide-enrich on of an oxide-enriched layer comprising a shiny, smooth surface.

In some cases, such as very high-dose implantation or an additional high-energy implantation with a non-metal hardening element, it is preferred to carry out the oxidative conversion so that a portion of the carbonized layer remains in or under the oxide-enriched layer after the oxidative conversion. This is referred to herein as "partial" oxidative conversion. In this case, some residual darkening of the carbonized layer remains. However, the existence of a carbonized subsurface layer can provide the extension of improved mechanical properties such as hardness and wear resistance below the oxide enriched surface layer. Also, carbonization would be expected to increase the surface hardness and wear resistance of the modified materials. This may be preferred in special applications where the modified material must have high erosion and oxidation resistance as well as high mechanical durability, for example in CFRP composites used in space or polymeric parts which are subject to wear in highly oxidative environments.

Preferably, the amount of oxygen incorporated in the oxidative conversion is sufficient to form a stable, uniform, continuous oxide-based surface layer, which preferably contains implanted ion species and oxygen in approximately stoichiometric proportions. For example, when the implanted ion is silicon, the amount of oxygen used in the second step of the process is preferably sufficient to oxidize the silicon to silicon dioxide, $SiO_2$. When the implanted species are Al, Sm or Gd, the amount of oxygen is preferably sufficient to form oxide-enriched layers based on $Al_2O_3$, $Sm_2O_3$ and $Gd_2O_3$, respectively. Similarly, when silicon and either boron or phosphorus are implanted in the top surface layer, the amount of oxygen is preferably sufficient to form an oxygen-containing material similar in composition of Si, B and O to borosilicate glass or similar in composition of Si, B and O to phosphorosilicate glass, respectively.

Ion implantation with ions of Al and Si+Al is preferred to provide polymers for space and many terrestrial applications, due to the transparency, hardness and wear resistance of $Al_2O_3$.

The rare-earth metals, Sm and Gd, are particularly preferred for use in surface modification of space-related polymers and composites because their oxides are easily formed and because the transparent oxides $Sm_2O_3$ and $Gd_2O_3$ have thermal expansion coefficients close to those of organic polymers used in space, such as Kapton. For example, Kapton has a coefficient of thermal expansion of about $20 \times 10^{-6}$/°C., whereas $Gd_2O_3$ and $Sm_2O_3$ have coefficients of thermal expansion of about $10 \times 10^{-6}$/°C. These oxides provide a better match for Kapton than $SiO_2$ and $Al_2O_3$, which have coefficients of thermal expansion of about $4 \times 10^{-6}$/°C. and $6 \times 10^{-6}$/°C., respectively. Therefore, it would be expected that polymers modified with Sm and Gd oxide-enriched surface layers would be highly resistant to thermal cycling damage, since the degree of expansion and contraction of the oxide-based layer in response to temperature fluctuations would be close to that experienced by the bulk polymer. On the other hand, for graphite and carbon fiber carbon composites, Si implantation is preferred because of the similarity in the coefficients of thermal expansion of graphite and silicon dioxide.

It is to be understood that the oxide-enriched surface layer produced according to the present invention has a composition which varies with depth. Although the oxide-enriched surface layer has been found to contain stoichiometric proportions of implanted elements and oxygen at its upper surface, the proportions may not be stoichiometric throughout the depth of the layer. Therefore, the above discussion of the suitability of certain elements based on thermal expansion coefficients provides only a guide as to the actual thermal expansion coefficient of any oxide-enriched surface layer.

The thickness of the oxide-enriched layer is variable and is at least partially dependent on the implanted species and the implantation and conversion conditions. However, it is preferred (as confirmed by SIMS analysis) that the thickness of the oxide-enriched surface layer be about 50 to about 200 nm with the content and stoichiometry of oxides being higher at the top surface of the substrate and gradually decreasing toward the bottom of the oxide-enriched surface layer.

Depending on the implantation and oxidation regimes, this oxide-enriched surface layer may preferably comprise only an upper portion of the implanted layer. Preferably, there is a sufficient concentration of implanted species in the underlying, non-oxidized, implanted layer so that if the oxide-enriched surface layer becomes damaged, an oxide-enriched layer may once again be formed by oxidation of the implanted species in this underlying implanted layer, giving the modified material "self-healing" properties. As discussed above, there may preferably be some carbonized subsurface layer in or under the oxide-enriched layer.

During the oxidative conversion, only ions in the uppermost implanted layer form an oxide-enriched layer while the lower implanted layer may remain unoxidized but highly carbonized. The carbonized sub-layer has increased electrical conductivity, hardness, wear-resistance and, to some extent, erosion-resistance. If the oxide-enriched layer is damaged then the lower carbonized layer provides a "second line of defence". Therefore, the process of the present invention provides materials having a novel graded 3-phase protective system: oxide-based electrically resistant top layer+carbonized sub-layer with increased conductivity+ underlying pristine material. The carbonized sub-layer typically also contains unoxidized implanted elements which provide the material with "self-healing" properties, as discussed above.

After the full or partial oxidative conversion, the water contact angle may decrease significantly compared to the pristine material and the material after implantation, depending mostly on the degree of conversion. Therefore, through ion implantation and oxidative conversion, it is possible to alter the hydrophobicity or hydrophilicity of the polymer surface, thus affecting properties such as wettability, paintability, printability and adhesion.

EXAMPLES

The following substrates were treated according to the process of the present invention in the following examples:

Kapton 500 HN-(PMDA-ODA) polyimide sheets with a thickness of 125 μm (5 mil) were obtained from DuPont.

Aluminized Kapton (Al-Kapton)-Polyimide (PMDA-ODA) sheets with a thickness of 76.2 μm (3 mil) aluminized (0.1 μm) on one side, was purchased from DuPont.

PEEK [poly(ether ether ketone)], with a thickness of 250 μm (10 mil), was obtained from ICL Mylar [poly(ethylene terephthalate)] sheets with a thickness of 25 μm (1.0 mil) were obtained from DuPont.

AS4/APC-2, 4-ply carbon fiber/PEEK matrix composite sheets were manufactured from prepreg material supplied by Fiberite.

"As deposited" pyrolytic graphite (HPG99) with a thickness of 0.2–0.28 mm was obtained from Union Carbide.

In the examples discussed below, the above polymer, graphite and composite samples were ion implanted and exposed for full or partial conversion according to the present invention, followed by testing in an atomic oxygen beam facility or in UV/air. This testing was done in order to determine the overall resistance of surface modified materials to highly oxidizing environments, such as FAO fluxes. Additional tests were performed to assess flexibility and resistance to thermal cycling of some modified polymer films and to demonstrate the alteration of surface energy. A number of analytical techniques, such as SEM, SIMS and RBS were used to characterize the samples and to confirm the results of the processes.

The samples which were exposed to FAO comprised 1.2 cm diameter discs. Each sample was held about its edges in a holder such that a 1.0 cm diameter area was exposed and the outer edge of the disc was masked by the holder. Each test sample was exposed to FAO at an average flux of about $(0.5–1) \times 10^{16}$ atoms/cm²s for a period of up to 5 hours, to provide a fluence of about $(1–2) \times 10^{20}$ atoms/cm², which is typical of fluences encountered in many space missions. FAO fluences were calculated based on the erosion yields of control (witness) Kapton samples.

The mass of each test sample was measured following exposure and the mass loss due to atomic oxygen erosion was computed using control Kapton samples to account for absorbed moisture. For some samples, intermediate observations and weighing were also conducted. For some samples, the total mass loss was compared with the value for untreated samples for the same time of exposure, and for others the kinetic plots of mass loss were measured. Some mass loss of surface-modified samples is expected due to etching of organic material from the implanted layer in the oxidative conversion process. This mass loss may partially be compensated by oxygen uptake due to oxidation of the implanted species. The surface morphology of the majority of the samples before and after testing was evaluated by Scanning Electron Microscopy (SEM) at different magnifications.

As discussed above, most of the ion implanted samples were exposed to FAO for a total period of 5 hours. This 5 hour test period comprised both the oxidative conversion step wherein the oxide-enriched surface layer is formed and the subsequent FAO testing step wherein mass loss of the modified samples is assessed.

Example 1

Kapton and PEEK were implanted with Al or Si at E=(25–40) keV with a dose of $1.5 \times 10^{16}$–$5 \times 10^{16}$ ions/cm²

(Table I, runs I, II, V, VIII). All samples were exposed to FAO for five hours for oxidative conversion and subsequent testing in the range of fluences $(1-2) \times 10^{20}$ atoms/cm$^2$ (Table II) typical for many space missions.

After ion implantation, all samples became darker, with the darkening being more noticeable at higher energies and fluences. At a fluence of $5 \times 10^{16}$ ions/cm$^2$ the samples had a grey lustrous (graphite-like) colour due to the surface carbonization caused by implantation. XPS (Table III) and Rutherford Backscattering Spectroscopy (RBS) analyses confirmed that carbonization had occurred in the implanted samples, with a reduction in oxygen content and an increase in carbon content. As evaluated by RBS, the retained dose for all samples was in the range of about 60 to 77% of the nominal dose, or fluence (Table I).

Table II shows the mass loss of Kapton samples after exposure to FAO for 5 hours, in comparison with the results for control samples of pristine material. For Si and Al implantation with a fluence of $1.5 \times 10^{16}$ ions/cm$^2$, mass loss decreased an average of 2-3 times (see sample $K_6$, for example). Visual observations show surface morphology changes, and SEM confirmed the formation of the well-known "carpet-like" structure of the surface, indicating insufficient protection in this case.

Al and Si were also implanted with a fluence of $5 \times 10^{16}$ ions/cm$^2$ (samples $K_3$ and $K_9$, respectively). It was shown by intermediate weighing that the major mass loss occurs during the first 0.5-1 hours, and that the samples mostly returned to their original colour and transparency. This indicates full conversion of the implanted layer to a transparent, colourless oxide-enriched layer, stable and highly protective to FAO. After 5 hours of FAO exposure, the full mass loss over the entire test period was approximately 5 times lower than for the control pristine material. However, for about the last 4 hours of the test period, after the formation of the oxide-enriched surface layer, no mass loss was detected.

Figure 4:
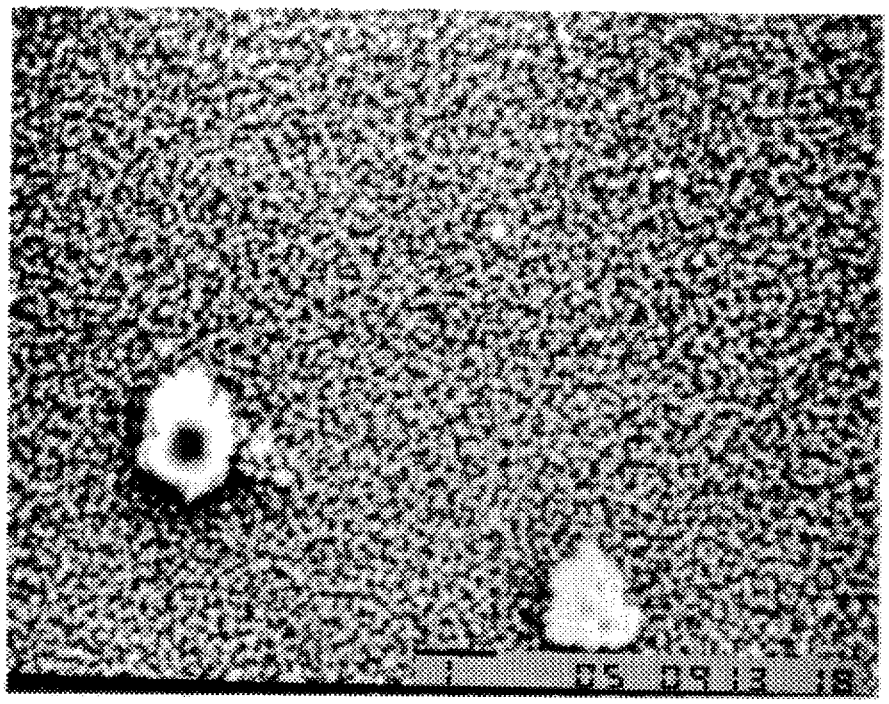
FIG. 4 is a scanning electron micrograph of a control, pristine Kapton sample after exposure to FAO for 5 hours, magnification 10,000×.
Figure 5:
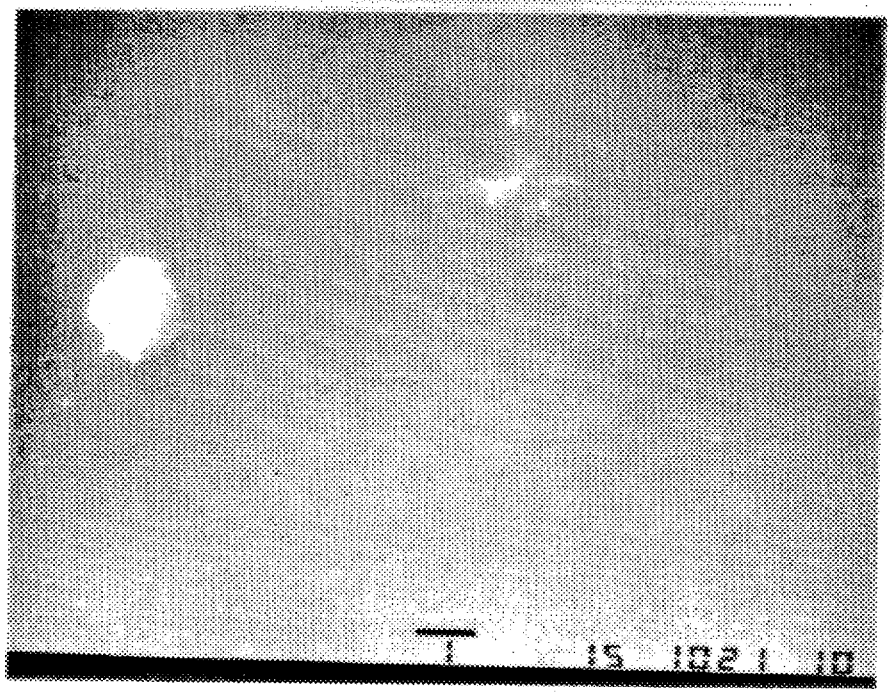
FIG. 5 is a scanning electron micrograph of a Si implanted Kapton sample ($K_9$, Example 1) after exposure to FAO for 5 hours, magnification 7,500×.

After completing 5 hours of FAO exposure, with FAO fluence of $\sim(1-2) \times 10^{20}$ atoms/cm$^2$, samples $K_3$ and $K_9$ were clear and transparent, with a glassy, shiny surface without any visual surface features, this being confirmed by SEM. For example, compare the relatively smooth surface of sample $K_9$ shown in the SEM micrograph of FIG. 5 with the roughened surface of pristine Kapton after FAO exposure shown in FIG. 4. The small defects visible in FIGS. 4 and 5 were identified as inorganic calcium phosphate $Ca_3(PO_4)_2$ contamination in the original sample. XPS data (Table III) confirms the formation of oxide-based surface layers in the samples ($K_3$/AO and $K_9$/AO), having high contents of Si and Al, respectively, as well as a high content of O, and with a strong decrease in carbon content. The ratio of Si and O is close to $SiO_2$ (sample $K_9$/AO), and the ratio of Al and O is close to $Al_2O_3$ (sample $K_3$/AO). High-resolution XPS also confirmed the formation of Al or Si oxides in the surface layer.

SIMS shows the penetration of Si or Al "tails" up to $\sim 1$ μm below the surface of the substrate, with redistribution of the maximum concentrations of Si and Al to the surface. SIMS also shows penetration of oxygen to about 0.2 μm below the surface during the conversion process. The presence of unoxidized implanted species below the oxide-enriched surface layer is highly important because it would be expected to permit self-healing in the event of surface damage to the modified surface in an oxidative environment.

Example 2

Kapton, Al-Kapton, Mylar, PEEK and carbon fiber/PEEK composites were implanted with Al, E=25 keV or Si, E=35 keV at a fluence of $7 \times 10^{16}$ ions/cm$^2$ (Runs IX and X, Table I).

Figure 6:
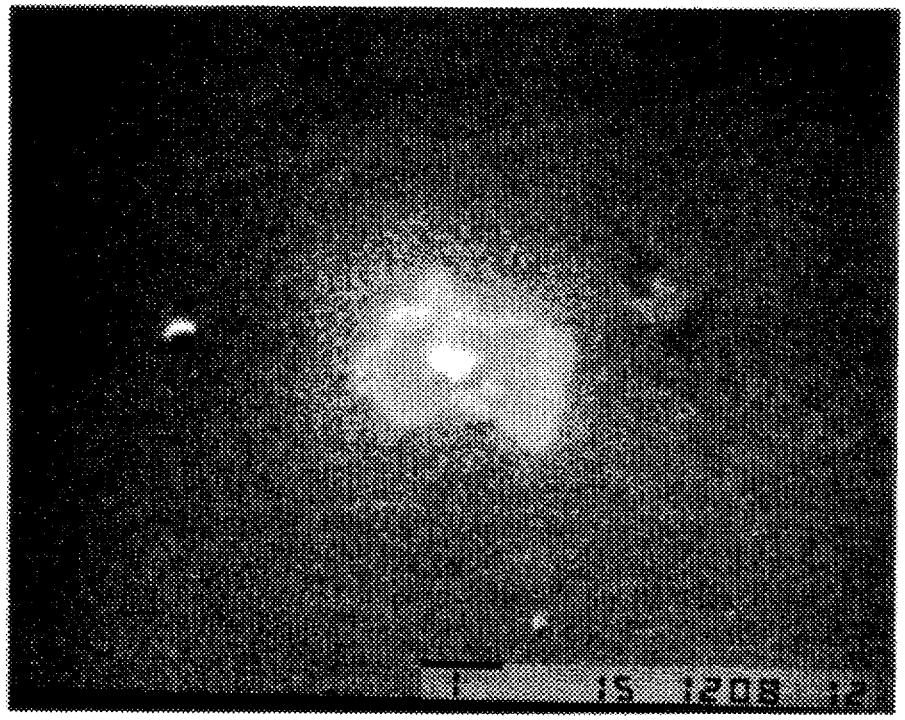
FIG. 6 is a scanning electron micrograph of an Al implanted Kapton sample ($K_{10}$, Example 2) after exposure to FAO for 5 hours, magnification 10,000×.

On implantation with $7 \times 10^{16}$ ions/cm$^2$ (close to the dose recommended by computer simulation and analytical calculations, based on the assumption of stoichiometric oxides formed after full conversion), the total mass loss over the entire period of FAO exposure was even lower than for the samples prepared in Example 1 (see, for example, Table II, Sample $K_{10}$). After 5 hours of FAO exposure, SEM shows the existence of a smooth, continuous stable layer for all the above mentioned materials. For example, FIG. 6 is an SEM micrograph of sample $K_{10}$, showing a primarily smooth surface with minor defects likely caused by contaminants in the original material. For both Al and Si high-dose implantations, SIMS analysis again showed a deep, approximately 1 μm "tail" of implanted elements, forming a good basis for "self-healing" of this layer in the event of surface damage an oxidative environment.

After oxidative conversion, the polymer samples appeared lighter in colour than after implantation. However, the original colour and degree of transparency were not fully restored. The carbon fiber/PEEK composite, which was black before treatment, obtained a grey shade after implantation which became lighter in colour after FAO exposure. However, the sample did not return fully to its original colour. This observation, together with SIMS and XPS data, shows not full conversion but partial conversion, with the existence of partial carbonization in the implanted layer.

Example 3

Graphite (HPG-99) was implanted with Si, E=35 keV at a fluence of $7 \times 10^{16}$ ions/cm$^2$ and subjected to oxidative conversion with FAO, and then tested under FAO for 4.5 hours (Sample $Gr^1{}_1$, Run X, Table I). A comparison of the mass-loss of a Kapton (witness) sample, an unimplanted graphite control sample, and implanted graphite specimen $Gr^1{}_1$ is shown in FIG. 8.

Erosion of the pristine graphite sample was observed throughout the test period with an average erosion yield $R_e$ of $1.23 \times 10^{-24}$ g/atom, the FAO exposed area appearing dark black after testing. The development of a "carpet-like" surface morphology on the pristine graphite sample under FAO exposure was confirmed by SEM.

Figure 8:
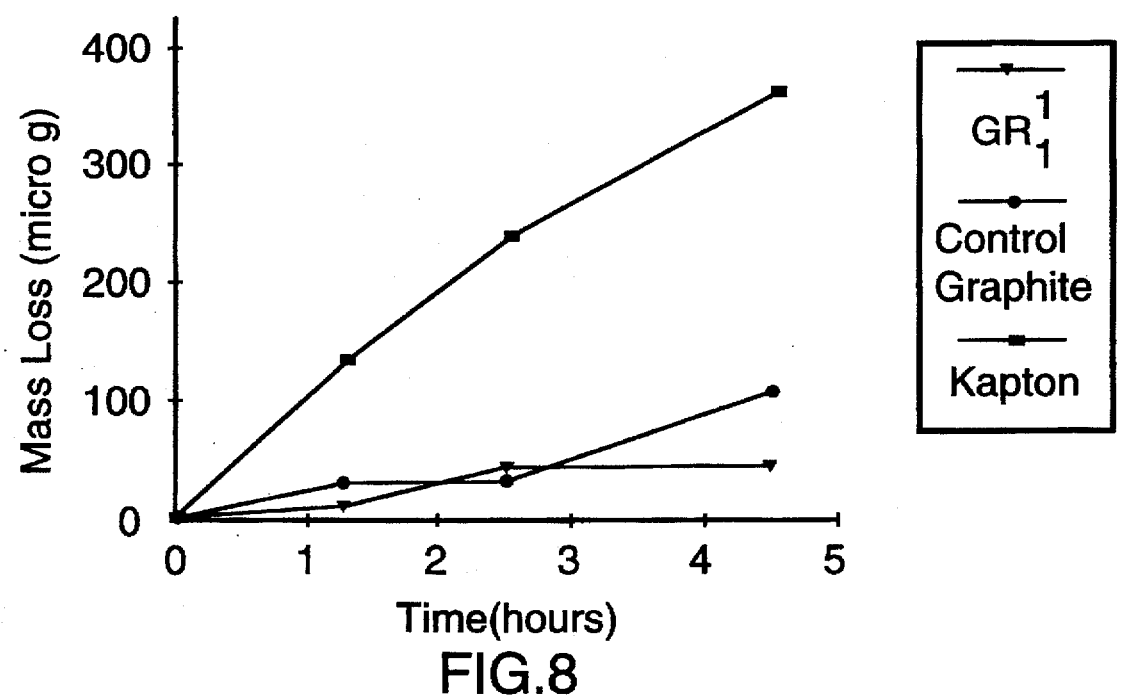
FIG. 8 is a plot of mass loss against time illustrating and comparing the mass loss for graphite implanted with Si ($Gr^1_1$, Example 3) with a control graphite sample and a "witness" pristine Kapton sample.

On the other hand, the implanted graphite sample $Gr^1{}_1$ showed self-stabilization after ~2.5 hours of exposure to FAO, without measurable mass-loss during an additional 2 hours of testing (FIG. 8). The area of sample $Gr^1{}_1$ exposed to FAO was a light shade of blue, and was clear and shiny without any visible erosion features.

Example 4

Kapton and PEEK were implanted with rare-earth elements, Sm and Gd, at E≈(25-50) keV and fluences of $(1.3, 1.5, 5, 7, 10) \times 10^{16}$ ions/cm$^2$ (Table I, Runs III, IV, XI-XIII). Surface carbonization (darkening) was observed to a higher degree, but with the same trends, as in Example 1, and was both visually evaluated and confirmed by XPS. Implantation of either Sm or Gd at $1.5 \times 10^{16}$ ions/cm$^2$ showed higher protective abilities than with the same dose of Al or Si. The observed mass loss of Sm and Gd implanted samples was close to zero for 2-hour exposure to FAO (Table IV, Samples $P_1$ and $P_3$).

After 5-hour exposure to FAO, mass loss was immeasurable by weighing for Sm implanted PEEK (Sample and Sm implanted Kapton (Sample $K_4$). SEM studies, however, showed some cracking of the thin, smooth, protective top surface layer of these samples after the 5-hour FAO exposure, and the existence of tiny, cone-like morphological features, with highly reduced dimensions, developed on the surfaces of treated material in the cracked areas. This means that the above mentioned implantation conditions are appropriate for a sufficient decrease in mass loss, but do not fully prevent the surface morphology changes.

Kapton samples implanted by Gd at E=50 keV and with fluences of (5, 7, 10)×$10^{16}$ ions/$cm^2$ (Table I, Samples $KT_1$, $KT_2$, $KT_3$) are expected to show very good results, either with full oxidative conversion (fluence of 5×$10^{16}$ ions/$cm^2$) or partial oxidative conversion (fluence of (7, 10)×$10^{16}$ atoms/$cm^2$) under FAO testing. Because of the better match in thermal expansion coefficient for the polymers and the rare-earth metal oxides, good stability to thermal cycling is expected as well.

Example 5

Kapton was implanted with Si with E=25 keV and at a fluence of 1.5×$10^{16}$ ions/$cm^2$, followed by B implantation with E=10 keV and a fluence of 5×$10^{15}$ ions/$cm^2$ (Run VI, Table I). After 5 hours of FAO testing, the mass loss was reduced by about two times relative to untreated Kapton, however, cone-like surface morphology formation was confirmed by SEM, indicating insufficient protection.

Based on computer simulations of dual low-energy implantation (FIG. 2), Kapton implanted with Si, E=25 keV at a fluence of 5×$10^{16}$ ions/$cm^2$, followed by B implantation at E=10 keV and a fluence of 1.7×$10^{16}$ ions/$cm^2$, would be expected to approximate the Si, B and O composition of borosilicate glass after oxidative conversion (Table I, Sample $K_8$). The amount of implanted Si has been confirmed with RBS, and the distribution of both Si and B after implantation and oxidative conversion, followed by FAO testing, was evaluated by SIMS.

Figure 7:
FIG. 7 is a scanning electron micrograph of a Si+B double implanted Kapton sample ($K_8$, Example 5) after exposure to FAO for 5 hours, magnification 1,000×.
Figure 9:
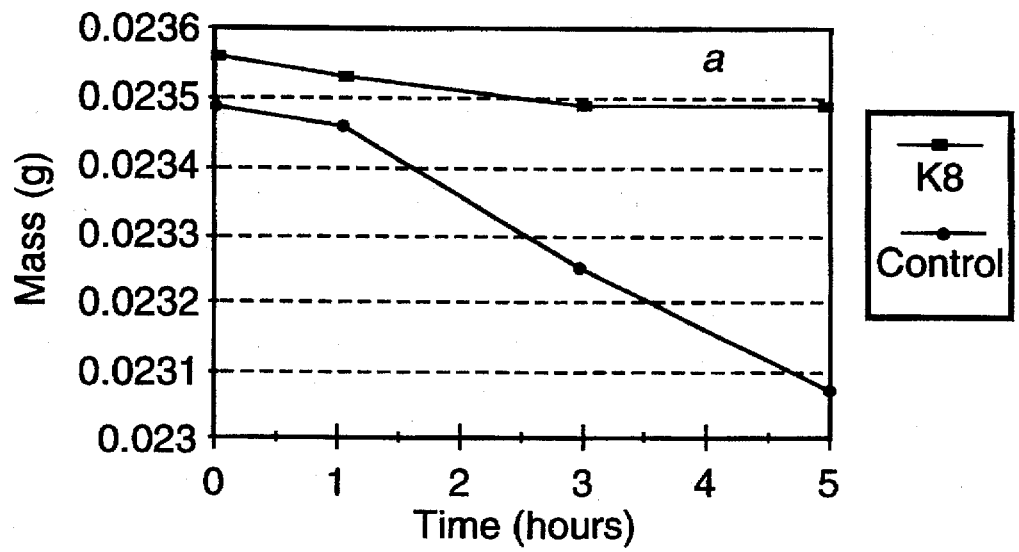
FIG. 9 is a plot of mass change against time of FAO exposure comparing the mass change of a Si+B double implanted Kapton sample ($K_8$, Example 5) with the mass change of a pristine, control Kapton sample.
Figure 10:
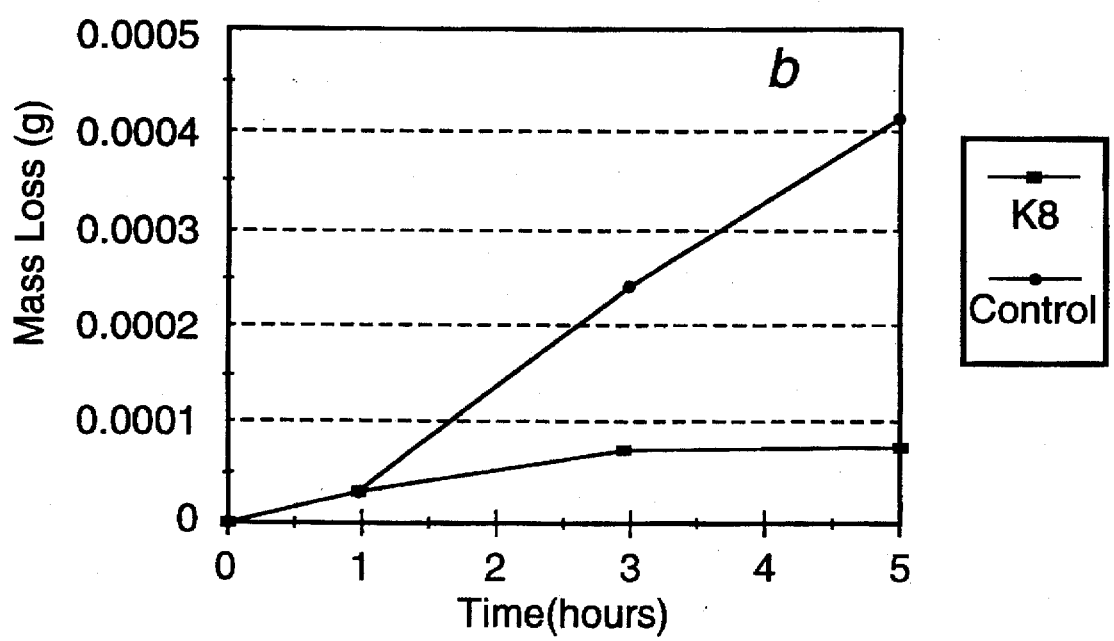
FIG. 10 is a plot of mass loss against time of FAO exposure comparing the mass loss of a Si+B double implanted Kapton sample ($K_8$, Example 5) with the mass loss of a pristine, control Kapton sample.

After 5 hours of FAO exposure for oxidative conversion and testing, the samples exhibited a shiny, glass-like, transparent surface very different from that of control Kapton exposed to FAO, and very similar to original Kapton (FIG. 7). The mass change and mass loss data graphs (FIGS. 9 and 10), obtained by weighing sample $K_8$ at equal intervals during the AO experiment, shows the kinetics of the process. Initially, the mass loss of sample $K_8$ was close to that of pristine Kapton. However, mass loss of $K_8$ dropped to zero after not more than two hours, i.e. after conversion of the implanted layer to a stable, protective surface, whereas mass loss of the control sample continued at an approximately constant rate.

XPS analysis (Table III) and SIMS data confirmed the formation of an oxide-based, glass-like layer, and SEM results showed a clear, smooth surface, well protected and highly erosion resistant.

Figure 11:
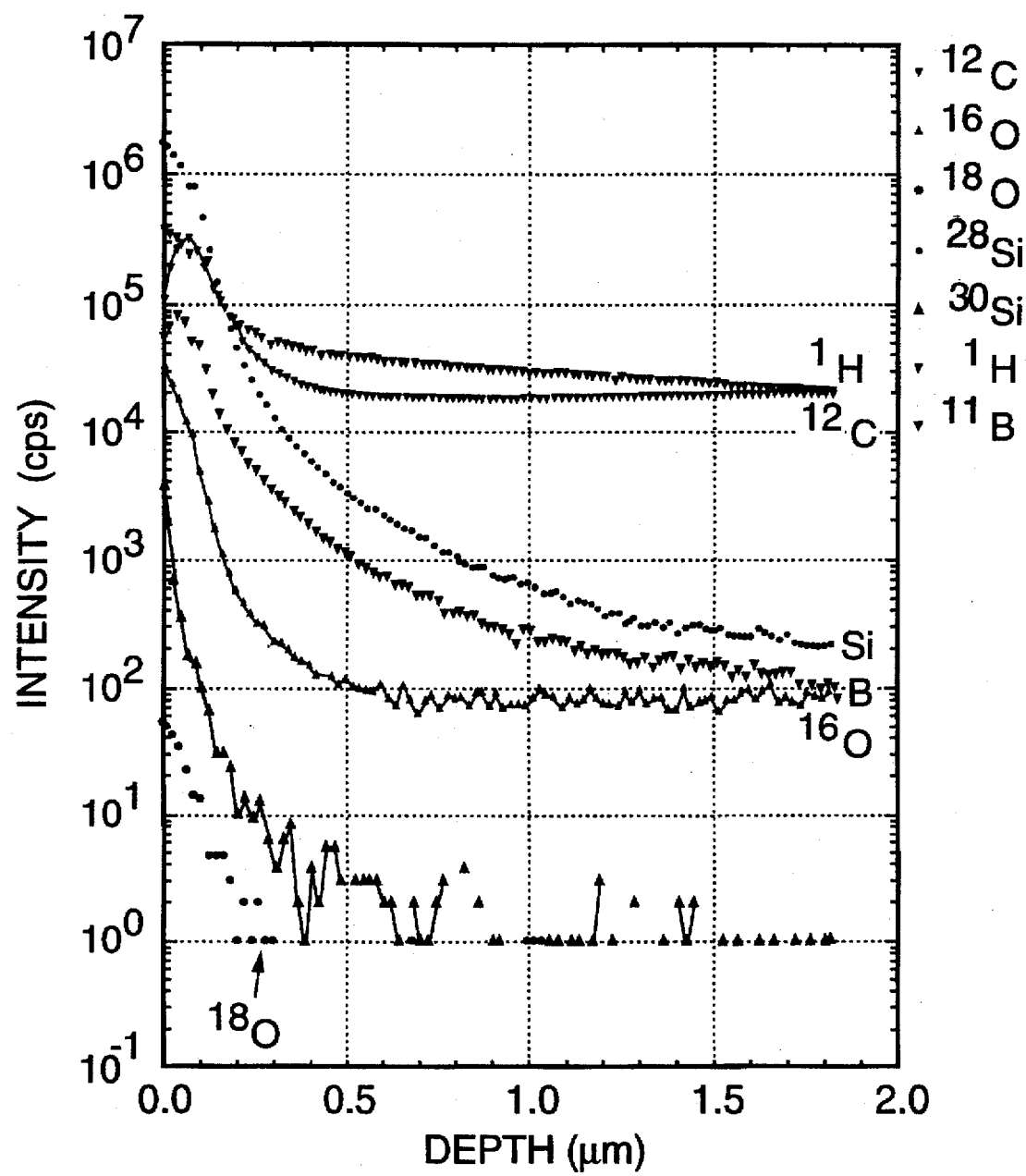
FIG. 11 is a plot of intensity against depth produced by Secondary Ion Mass Spectroscopy (SIMS) for Kapton sample $K_8$ after FAO exposure.

FIG. 11 graphically illustrates the SIMS data for sample $K_8$ produced by sputtering the sample with a beam of $O^{16}$. The SIMS data shows the presence of B and Si "tails" to a depth of $\geq$ about 1.5 µm. Further, the molar ratio of Si:B remains relatively constant at about 3:1 throughout the depths at which these ions appear, although Si is redistributed somewhat toward the surface. From the distribution of $O^{18}$ shown in FIG. 11, it is clear that the oxide-enriched surface layer is graded and has a depth of about 0.2 µm.

High-dose ion implantation often causes surface embrittlement of polymer films. Testing of the flexibility of the modified films of Examples 1-3 and 5 after 5 hours of FAO exposure was conducted by repeated twisting, with subsequent evaluation of the surface structure by optical microscopy and SEM. The study did not show any crack formation, which confirms the flexibility of the films after the conversion.

Example 6

Kapton, Mylar, PEEK, graphite (HPG99) and carbon fiber/PEEK composites were dual implanted with Al, E=35 keV, fluence of 5×$10^{16}$ ions/$cm^2$ and Si, E=35 keV, fluence of 2×$10^{16}$ ions/$cm^2$ (Table V, Run II). It was confirmed by Energy Dispersive X-ray Spectroscopy (EDS) that the ratio of the retained doses of the Al and Si ions was approximately the same as the ratio of their fluences.

Dual implantation of Si and Al at these regimes is highly beneficial because of the strong redistribution of the maximum of Si atoms to the surface at the oxidative conversion stage, as shown by SIMS (in Example 1), and the outstanding mechanical properties and surface durability of aluminum oxides. After 5 hours of FAO exposure for conversion and testing, all polymer and composite samples exhibited a shiny, smooth surface.

Figure 12:
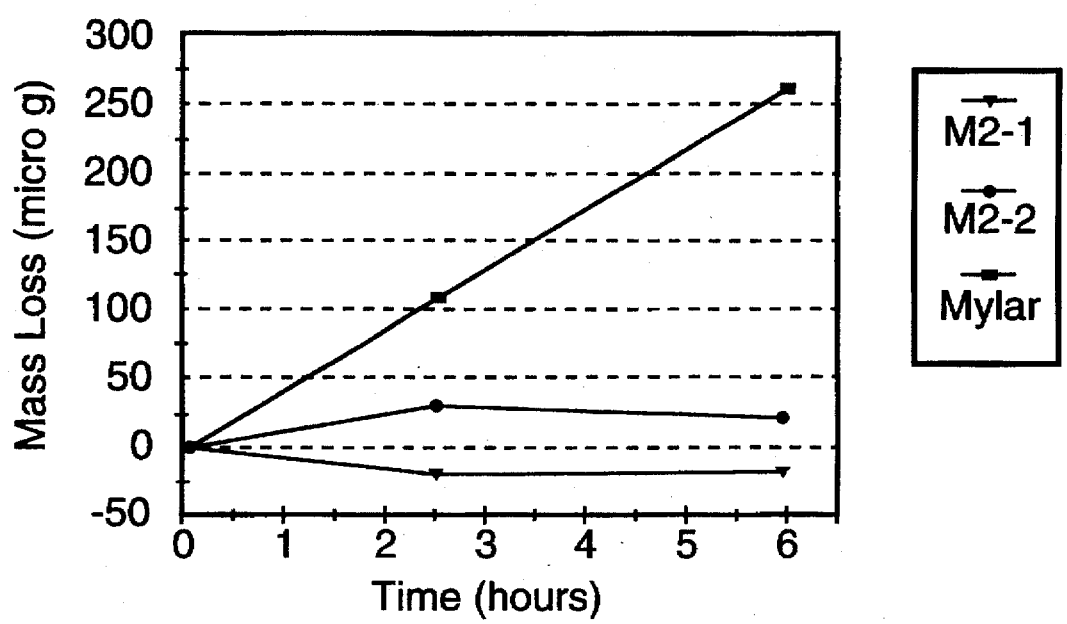
FIG. 12 is a plot of mass loss against time of FAO exposure comparing the mass loss of Al+Si double implanted Mylar ($M^1_2$, Example 6), Al+Si+B triple implanted Mylar ($M^2_2$, Example 7) and a pristine control sample of Mylar.
Figure 13:
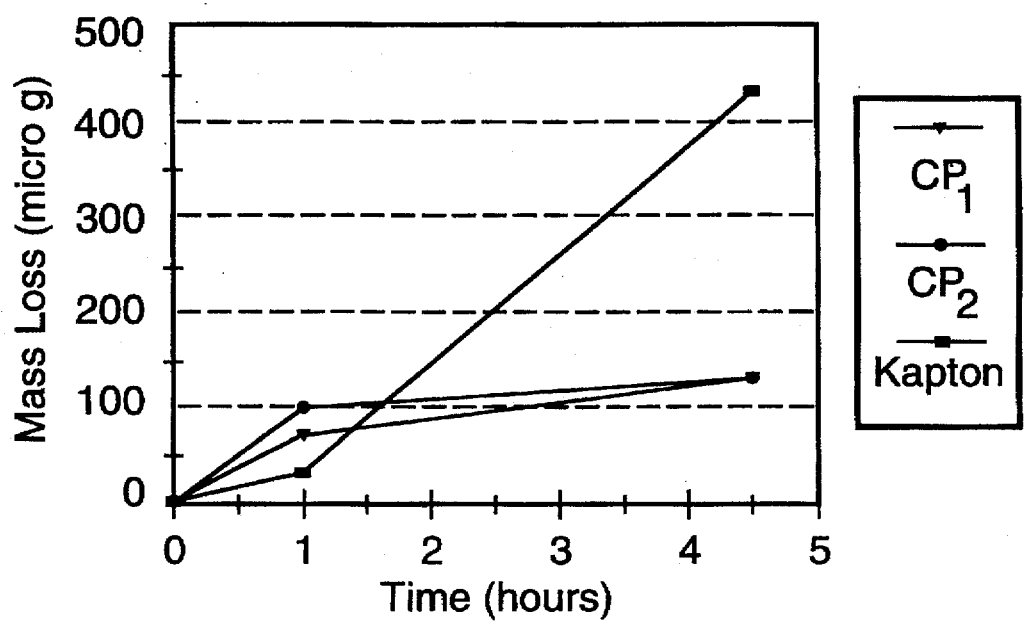
FIG. 13 is a plot of mass loss against time of FAO exposure comparing mass loss of Al+Si double implanted carbon fiber/PEEK composite ($CP_1$, Example 6), Al+Si+B triple implanted carbon fiber/PEEK composite ($CP_2$, Example 7), and a witness sample of pristine Kapton.

Kinetic plots of mass loss under FAO exposure are presented in FIG. 12 for Mylar ($M^1_2$), and for composite (sample $CP_1$) in FIG. 13, together with the results for pristine Mylar and control Kapton. FIGS. 12 and 13 clearly show strong improvements in erosion resistance due to self-stabilization under FAO for samples $M^1_2$ and $CP_1$, respectively. For sample $M^1_2$ (FIG. 12), the FAO flux was 4.57×$10^{15}$ atoms/$cm^2$ sec, fluence 9.87×$10^{19}$ atoms/$cm^2$, translating to exposure to the LEO space environment at 400 km altitude for about 114 days. Similarly, for sample $CP_1$ (FIG. 13), the FAO flux was 1.25×$10^{16}$ atoms/$cm^2$ sec, fluence 2.02×$10^{20}$ atoms/$cm^2$, equivalent to about 234 days in LEO at an altitude of about 400 km.

Example 7

Samples implanted with Si as in Example 2 and with Al and Si as in Example 6 were further implanted with B, E=100 keV, fluence of 1×$10^{16}$ ions/$cm^2$ (Table V, Runs I and III). After implantation of Si and/or Al, darkening was seen with all polymers as in Example 6. After additional implantation with B, all the samples became black. A specific grey shade appeared on both graphite ($Gr^2_1$) and (originally black) composites ($CP_2$).

After the initial oxidative conversion stage under FAO, the samples showed a strong decrease in mass loss to almost immeasurable levels during subsequent FAO testing. The results for Mylar ($M^2_2$) and the carbon fiber/PEEK composite ($CP_2$) are presented in FIGS. 12 and 13, respectively. The results for graphite ($Gr^2_1$) are the same as that presented in FIG. 8 for sample $Gr^1_1$. For the composite sample $CP_2$, the conversion and stabilization under FAO occurs with slower kinetics than for sample $CP_1$ implanted as in Example 6. However, the conversion and stabilization of all the implanted samples fully protected them from erosion under FAO fluxes.

Stabilization of the surface layer by conversion and subsequent testing of UV/oxidation resistance was also performed for samples implanted as in Example 6 and in this example. The samples were exposed to UV radiation in the 254 and 185 nm range (predominantly 254 nm), in the presence of air. The films were placed approximately 5 mm from the UV source with the UV dose being up to 270 J/$cm^2$ (about 15 hours). It was found by EDS that oxygen uptake was strongest for Kapton, followed by Mylar and PEEK.

The oxidation, turbidity and surface deterioration was visually evaluated on all pristine control polymer samples. The implanted samples were shiny and glassy, and, when implanted as in Example 6, showed complete restoration of initial colour and degree of transparency for Kapton, and noticeable lightening for aluminized Kapton, Mylar and PEEK, indicating full or partial surface conversion. The samples implanted as in Example 7 remained black, but with a lighter shade. The XPS analysis (Table VI) shows appearance of oxidized Si, Al, or both, at the surface, and reduction of carbon content, confirming partial surface conversion to a different degree.

The water contact angle measurements indicate a strong decrease in the angle value under UV/air exposure. For example, water contact angles decreased from 82°–85° for implanted materials to 43°–45° after UV/air exposure on Si implanted materials, and to 54° on Si+B implanted materials (Table VII). This shows a strong increase in hydrophilicity due to oxide-based surface layer formation.

As an alternative to FAO, an appropriate oxygen plasma treatment may be used for oxidative conversion in all Examples mentioned above, with the advantage of decreasing the time required for the conversion stage.

TABLE I

Conditions of Ion Implantation for Kapton (K), Aluminized Kapton (AK), PEEK (P), Mylar (M) and graphite (Gr).

| Run Number | Sample | Ion | Energy (keV) | Fluence Ions/cm$^2$ | Retained Dose by RBS |
|---|---|---|---|---|---|
| I | $K_2$, $P_2$ | $Al^{27}$ | 25 | $1.5 \times 10^{16}$ | 67% |
| II | $K_3$ | $Al^{27}$ | 40 | $5 \times 10^{16}$ | 77% |
| III | $K_4$, $P_3$ | $Sm^{152}$ | 20 | $1.3 \times 10^{16}$ | 69% |
| IV | $K_5$, $P_1$ | $Gd^{158}$ | 20 | $1.3 \times 10^{16}$ | 70% |
| V | $K_6$, $P_4$ | $Si^{28}$ | 25 | $1.5 \times 10^{16}$ | ~60% |
| VI | $K_7$ | $Si^{28}$ + $B^{11}$ | 25 10 | $1.5 \times 10^{16}$ $5 \times 10^{15}$ | |
| VII | $K_8$ | $Si^{28}$ + $B^{11}$ | 25 10 | $5 \times 10^{16}$ $1.7 \times 10^{16}$ | |
| VIII | $K_9$ | $Si^{28}$ | 40 | $5 \times 10^{16}$ | 66% |
| IX | $K_{10}$, $P_7$ | $Al^{27}$ | 25 | $7 \times 10^{16}$ | |
| X | $AK_3^1$, $M_3^1$, $P_9^1$, $Gr_1^1$ | $Si^{28}$ | 35 | $7 \times 10^{16}$ | |
| XI | $KT_1$ | $Gd^{158}$ | 50 | $5 \times 10^{16}$ | |
| XII | $KT_2$ | $Gd^{158}$ | 50 | $7 \times 10^{16}$ | |
| XIII | $KT_3$ | $Gd^{158}$ | 50 | $1 \times 10^{17}$ | |

TABLE II

Results of 5 Hour FAO Exposure for Si and Al Ion Implanted Kapton

| Sample | FAO Fluence (atoms/cm$^2$) | Mass Loss (μg) |
|---|---|---|
| $K_6$ | $1.27 \times 10^{20}$ | 150 |
| K contr. | $1.27 \times 10^{20}$ | 270 |
| $K_3$ | $1.69 \times 10^{20}$ | 80 |
| K contr. | $1.69 \times 10^{20}$ | 360 |
| $K_9$ | $1.55 \times 10^{20}$ | 60 |
| K contr. | $1.55 \times 10^{20}$ | 330 |
| $K_7$ | $1.3 \times 10^{20}$ | 100 |
| K contr. | $1.3 \times 10^{20}$ | 270 |
| $K_{10}$ | $1 \times 10^{20}$ | 40 |
| K contr. | $1 \times 10^{20}$ | 210 |

TABLE III

XPS Surface Composition for Kapton Samples as Implanted and After 5 Hour FAO Exposure

| Sample No. | C | O | N | Si | Al |
|---|---|---|---|---|---|
| K contr. | 79.6 | 14.3 | 5.4 | — | — |
| $K_3$ impl. | 88 | 8.0 | — | 4.2 | — |
| $K_3$/AO | 28 | 45 | 2.7 | — | 24 |
| $K_9$ impl. | 87 | 7.6 | 2.5 | 2.3 | — |
| $K_9$ (masked) | 72 | 18 | 7 | 2.5 | — |
| $K_9$/AO | 17 | 54 | — | 29 | — |
| $K_8$/AO | 24 | 46 | — | 30 | — |

TABLE IV

Results of FAO Exposure for Sm and Gd Ion Implanted PEEK and Kapton

| Sample | Time (hours) | Fluence (atoms/cm$^2$) | Mass Loss (μg) |
|---|---|---|---|
| $P_1$ | 2 | $6.13 \times 10^{19}$ | 0 |
|  | 5 | $1.53 \times 10^{20}$ | 70 |
| $P_3$ | 2 | $6.13 \times 10^{19}$ | 0 |
|  | 5 | $1.53 \times 10^{20}$ | 0 |
| P contr. | 2 | $6.13 \times 10^{19}$ | 70 |
|  | 5 | $1.53 \times 10^{20}$ | 350 |
| $K_4$ | 5 | $1.5 \times 10^{20}$ | 0 |
| K contr. | 5 | $1.5 \times 10^{20}$ | 320 |

TABLE V

Conditions of Multiple Ion Implantation for Kapton (K), Al-Kapton (AK), PEEK (P), Mylar (M), Graphite (Gr) and Graphite/PEEK Composite (CP)

| Run Number | Sample | Ion | Energy (keV) | Fluence (ions/cm$^2$) |
|---|---|---|---|---|
| I | $AK_3^2$, $M_3^2$, $P_9^2$, $Gr_1^2$ | $Si^{28}$ + $B^{11}$ | 35 100 | $7 \times 10^{16}$ $1 \times 10^{16}$ |
| II | $K^{112}$, $M_2^1$, $P_8^1$, $CP_1$ | $Al^{27}$ + $Si^{28}$ | 35 35 | $5 \times 10^{16}$ $2 \times 10^{16}$ |
| III | $K_{12}^2$, $M_2^2$, $P_8^2$, $CP_2$ | $Al^{27}$ + $Si^{28}$ + $B^{11}$ | 35 35 100 | $5 \times 10^{16}$ $2 \times 10^{16}$ $1 \times 10^{16}$ |

TABLE VI

XPS Surface Composition (at. %) of Ion Implanted Polymer Samples After UV/Air Exposure

| Sample | C | O | N | Si | Al | Other |
|---|---|---|---|---|---|---|
| Mylar (pristine) | 78 | 22 | — | — | — | — |
| Mylar ($M_2^1$) (Al + Si) | 81.3 | 14 | 2.5 | 1.4 | 0.3 | 0.4 Sn |
| Mylar ($M_2^2$) (Al + Si + B) | 61.3 | 24.1 | 1.3 | 3.3 | 8.7 | 1.2 |
| Mylar ($M_3^1$) (Si, high-dose) | 66.5 | 24.5 | 1.4 | 6.4 | — | 1.1 Sn |
| Mylar ($M_3^2$) (Si + B) | 55.5 | 28.9 | 1.0 | 11 | 2.7 | 0.85 Sn |
| PEEK (pristine) | 85.6 | 12.7 | — | 1.7 | — | — |
| PEEK ($P_9^1$) (Si, high-dose) | 33.1 | 45.1 | 1.3 | 17.9 | — | 2.5 Sn |
| PEEK ($P_9^2$) (Si + B) | 66.5 | 22.3 | — | 9.9 | — | 1.2 Sn |

TABLE VII

Summary of Water Contact Angles for Polymer Films as Measured After Different Stages of Modified Ion Implantation Process, 20° C.

| Polymer | Pristine | Implanted | Water Contact Angle After Different Stages in the Process (deg) After UV/Air Exposure |
|---|---|---|---|
| Mylar ($M_3^1$) | 77 | (High-dose Si) 83 | 54 |
| Mylar ($M_2^3$) | 77 | (Si + B) 83 | 43 |
| PEEK ($P_9^1$) | 72 | (High-dose Si) | 45 |
| PEEK ($P_9^2$) | 72 | (Si + B) 82 | 54 |

In the above examples, it is to be understood that the rate of mass loss of materials modified according to the present invention does not remain constant throughout the FAO exposure period. Rather, most or all of the mass loss occurs during the initial oxidative conversion phase when the implanted layer is etched to expose the implanted ion species for oxidation. Once an oxide-enriched surface layer forms, mass loss is significantly reduced and preferably ceases altogether during the remaining time of the test period.

The erosion yields of the modified materials during the time period after formation of the oxide-enriched surface layer, that is after oxidative conversion, are on the order of at least two orders of magnitude smaller than the erosion yields of pristine materials. Preferably, the modified materials have an erosion yield of less than about $10^{-26}$ g/atom of atomic oxygen. This roughly translates to an etch rate ratio of greater than 100, meaning that erosion resistance of materials modified according to the present invention is preferably at least 100 times greater than that of unmodified materials.

It is to be understood that the above estimates of erosion yield are based on the lower limits of mass loss measurements obtained by weighing. The actual values of erosion yield of materials modified according to the present invention may in fact be lower than $10^{-26}$ g/atom of atomic oxygen.

Throughout the disclosure, it is taught that materials treated according to the present invention may experience a mass loss of zero when exposed to FAO flux. It is to be understood that this means mass loss was immeasurable, as determined by mass measurements. SEM was performed on the samples to confirm that FAO exposure had not caused the formation of morphological surface features, which signifies that the samples have been fully protected.

Although the invention has been described in connection with certain preferred embodiments, it is not intended that it be limited thereto. Rather, it is intended that the invention cover all alternate embodiments as may be within the scope of the following claims.

We claim:

1. A surface modification process for forming a continuous, oxide-enriched surface layer on a solid substrate, said process comprising:

(a) ion implantation of the solid substrate comprising bombardment of said substrate with at least one ion species selected from the group comprising ions of metal and semi-metal elements capable of forming oxides, to form an upper implanted layer of the substrate containing at least one implanted element selected from said metal and semi-metal elements, a first graded transition being formed between the implanted layer and underlying substrate; and (b) oxidative conversion, by an active oxygen species, of at least an upper portion of said implanted layer, said oxidative conversion comprising etching by said active oxygen species of material from said implanted layer and oxidation by said active oxygen species of said implanted elements in at least said upper portion of said implanted layer to form said continuous, oxide-enriched surface layer containing a protective compound formed by combination of at least one of said implanted elements with oxygen, said solid substrate being selected from the group comprising organic polymers, metallized polymer films, graphite and carbon fiber reinforced composite of carbon based materials, said polymers and polymer films containing carbon and hydrogen;

said continuous, oxide-enriched surface layer having an erosion yield on the order of or less than about $10^{-26}$ g/atom of atomic oxygen when exposed to said atomic oxygen having kinetic energy of from about 1 eV to about 5.3 eV.

2. The surface modification process of claim 1, wherein said metal elements are multivalent metal elements selected from the group comprising Al, Ti, Sc, Sn, Zr, Hf, Cr, Mo, V, Ce, Sm and Gd, and wherein said semi-metal element is Si.

3. The surface modification process of claim 1, wherein the oxide of the continuous, oxide-enriched surface layer and the solid substrate have coefficients of thermal expansion differing from one another by a factor of up to about 2.

4. The surface modification process of claim 1, said ion implantation additionally comprising bombardment of said substrate with an ion species comprising ions of a non-metal element, such that said protective compound contains said non-metal element.

5. The surface modification process of claim 4, wherein the ion species comprise ions of Si and B such that said protective compound comprises Si, B and O.

6. The surface modification process of claim 4, wherein the ion species comprise ions of Si and P such that said protective compound comprises Si, P and O.

7. The surface modification process of claim 1, said ion implantation additionally comprising bombardment of said substrate with an ion species comprising ions of a non-metal element to form a carbonized sub-layer containing said non-metal element underneath said upper implanted layer.

8. The surface modification process of claim 1, wherein the ion species are implanted with an energy of about 25 keV to about 50 keV and a fluence of about $5 \times 10^{16}$ ions/cm$^2$ to about $1 \times 10^{17}$ ions/cm$^2$.

9. The surface modification process of claim 4, wherein the non-metal ion species is implanted with an energy of about 10 keV to about 100 keV and a fluence of about $5 \times 10^{15}$ ions/cm$^2$ to about $10^{16}$ ions/cm$^2$.

10. The surface modification process of claim 1, wherein said solid substrate is an organic polymer selected from the group comprising polyolefins, polyacrylates, polycarbonates, polyesters, polyethers, polyurethanes, polyamides and polyimides.

11. The surface modification process of claim 10, wherein said organic polymer is selected from the group comprising polypyromellitimide polyimide, polyethylene terephthalate, and polparyl ether ether ketone.

12. The surface modification process of claim 1, wherein the active oxygen species is selected from the group comprising atomic oxygen having kinetic energy of from about 1 eV to about 5.3eV, UV+air, UV+ozone and oxygen plasma.

13. The surface modification process of claim 1, wherein the surface layer is transparent and said said substrate after surface modification has a color which is the same as that of said solid substrate prior to surface modification.

14. The surface modification process of claim 1, wherein said solid substrate is a metallized polymer film comprising a film of polypyromellitimide polyimide having a layer of aluminum on one side thereof.

15. The surface modification process of claim 1, wherein said solid substrate is a carbon fiber reinforced composite material comprising carbon fibers in a matrix of epoxy resin, polyaryl ether ether ketone or resin-derived carbon.

16. The surface modification process of claim 1, wherein only said upper portion of said upper layer is oxidatively converted by said active oxygen species, such that a second graded transition is formed between said oxide-enriched surface layer and said implanted layer underlying said surface layer.

17. The surface modification process of claim 1, wherein said ion implantation and said oxidative conversion are performed sequentially.

18. The surface modification process of claim 4, wherein the non-metal ion species is boron implanted with an energy of about 10 keV and a fluence of about $5 \times 10^{15}$ ions/cm$^2$.

19. The surface modification process of claim 7, wherein the non-metal ion species is boron implanted with an energy of about 100 keV and a fluence of about $1 \times 10^{16}$ ions/cm$^2$.

* * * * *